(12) United States Patent
Lee et al.

(10) Patent No.: US 9,196,358 B2
(45) Date of Patent: *Nov. 24, 2015

(54) NONVOLATILE MEMORY DEVICE USING VARIABLE RESISTANCE MATERIAL AND METHOD FOR DRIVING THE SAME

(71) Applicant: Samsung Electronics Co., Ltd., Suwon-si (KR)

(72) Inventors: Sung Yeon Lee, Seoul (KR); Yeong-Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/963,417

(22) Filed: Aug. 9, 2013

(65) Prior Publication Data

US 2014/0119095 A1 May 1, 2014

(30) Foreign Application Priority Data

Oct. 29, 2012 (KR) ........................ 10-2012-0120534

(51) Int. Cl.
| G11C 13/00 | (2006.01) |
| G11C 11/16 | (2006.01) |
| G11C 11/56 | (2006.01) |

(52) U.S. Cl.
CPC .......... *G11C 13/004* (2013.01); *G11C 11/5678* (2013.01); *G11C 11/5685* (2013.01); *G11C 13/0061* (2013.01); *G11C 11/16* (2013.01); *G11C 11/5607* (2013.01);
(Continued)

(58) Field of Classification Search
CPC ............ G11C 11/00; G11C 7/06; G11C 7/12; G11C 13/0069; G11C 13/0004; G11C 13/0007; G11C 2213/79; G11C 2213/72

USPC ................ 365/189.05, 148, 210, 163, 189.15
See application file for complete search history.

(56) References Cited

U.S. PATENT DOCUMENTS

| 6,282,133 | B1 | 8/2001 | Nakagawa et al. |
| 6,870,785 | B1 | 3/2005 | Kang |
| 7,830,705 | B2 | 11/2010 | Jeong |

(Continued)

FOREIGN PATENT DOCUMENTS

| KR | 101997071793 | 11/1997 |
| KR | 1020010050433 | 6/2001 |

(Continued)

*Primary Examiner* — Shawki S Ismail
*Assistant Examiner* — Muhammad S Islam
(74) *Attorney, Agent, or Firm* — Onello & Mello, LLP

(57) ABSTRACT

The nonvolatile memory device using a variable resistance material and a method for driving the same are provided. A first clamping unit connected between a resistance memory cell and a first sensing node to provide a first clamping bias to the resistance memory cell. The first clamping bias changes over time. A first compensation unit provides a compensation current to the first sensing node. A first sense amplifier is connected to the first sensing node to sense a level change of the first sensing node. In response to if first data stored in the resistance memory cell, an output value of the first sense amplifier transitions to a different state after a first amount of time from a time point from where the first clamping bias starts. In response to second data that is different from the first data stored in the resistance memory cell, the output value of the first sense amplifier transitions to the different state after a second amount of time that is different from the first amount of time from the time point from where the first clamping bias starts.

23 Claims, 25 Drawing Sheets

(52) U.S. Cl.
CPC ....... *G11C 13/0004* (2013.01); *G11C 13/0007* (2013.01); *G11C 2213/71* (2013.01); *G11C 2213/72* (2013.01)

(56) References Cited

U.S. PATENT DOCUMENTS

| | | | |
|---|---|---|---|
| 2001/0012228 A1* | 8/2001 | Perner | ............................ 365/210 |
| 2005/0052896 A1 | 3/2005 | Kang | |
| 2008/0117675 A1 | 5/2008 | Haque et al. | |
| 2009/0225594 A1 | 9/2009 | Choi et al. | |
| 2010/0085799 A1 | 4/2010 | Cho et al. | |
| 2012/0063195 A1* | 3/2012 | Lam et al. | ....................... 365/148 |
| 2012/0287730 A1* | 11/2012 | Kim | ........................... 365/189.06 |
| 2013/0221315 A1* | 8/2013 | Wang et al. | ........................ 257/4 |

FOREIGN PATENT DOCUMENTS

| | | |
|---|---|---|
| KR | 100506458 | 7/2005 |
| KR | 1020050118331 | 12/2005 |
| KR | 100634169 | 10/2006 |

\* cited by examiner

FIG. 1A

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(2_1) | | SA/WD(2_2) | | SA/WD(2_3) | | SA/WD(2_4) | |
| | PERIPHERY(3) | | | | | | | |
| | SA/WD(2_8) | | SA/WD(2_7) | | SA/WD(2_6) | | SA/WD(2_5) | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

1

NONVOLATILE MEMORY DEVICE USING VARIABLE RESISTANCE MATERIAL AND METHOD FOR DRIVING THE SAME

CROSS-REFERENCE TO RELATED APPLICATIONS

This application is based on and claims priority from Korean Patent Application No. 10-2012-0120534, filed on Oct. 29, 2012 in the Korean Intellectual Property Office, the contents of which are incorporated herein in its entirety by reference.

BACKGROUND

1. Field of the Inventive Concept

The present inventive concept relates to a nonvolatile memory device that includes a variable resistance material and a method for driving the same.

2. Description of the Related Art

A nonvolatile memory device having a resistance material includes a phase change random access memory (PRAM), a resistive RAM (RRAM), a magnetic RAM (MRAM), and the like. A dynamic RAM (DRAM) or a flash memory device stores data using charges. On the other hand, a nonvolatile memory device having the resistance material stores data according to the state change of a phase change material such as a chalcogenide alloy (in the case of a PRAM), a resistance change of a variable resistance material (in the case of an RRAM), a resistance change of a magnetic tunnel junction (MTJ) according to a magnetization state of a ferromagnetic material (in the case of an MRAM), and the like.

Here, a phase change memory cell will be described by way of example. A state of a phase change material is changed to a crystal state or an amorphous state while the phase change material is cooled after being heated. The phase change material in a crystal state has low resistance, and the phase change material in an amorphous state has high resistance. Accordingly, the crystal state may be defined as set data or 0 data, and the amorphous state may be defined as reset data or 1 data.

SUMMARY

One subject to be solved by the present inventive concept is to provide a nonvolatile memory device with improved read reliability.

Another subject to be solved by the present inventive concept is to provide a method for driving a nonvolatile memory device with improved read reliability.

Additional advantages, objects, and features of the inventive concept will be set forth in part in the description which follows and in part will become apparent to those having ordinary skill in the art upon examination of the following or may be learned from practice of the inventive concept.

According to an aspect of the present inventive concept, there is provided a nonvolatile memory device. A first clamping unit connected between a resistance memory cell and a first sensing node to provide a first clamping bias to the resistance memory cell. The first clamping bias changes over time. A first compensation unit provides a compensation current to the first sensing node. A first sense amplifier is connected to the first sensing node to sense a level change of the first sensing node. In response to if first data stored in the resistance memory cell, an output value of the first sense amplifier transitions to a different state after a first amount of time from a time point from where the first clamping bias starts. In response to second data that is different from the first data stored in the resistance memory cell, the output value of the first sense amplifier transitions to the different state after a second amount of time that is different from the first amount of time from the time point from where the first clamping bias starts.

In some embodiments, the first sense amplifier operates multiple times in response to an enable signal that becomes active multiple times during a read period.

In some embodiments, the nonvolatile memory device further comprises an enable signal generation unit that generates the enable signal, wherein the enable signal generation unit includes a plurality of reference resistors, and an active time point of the enable signal differs to correspond to resistance values of the reference resistors.

In some embodiments, the read period is a normal read period, and wherein the reference resistor includes the resistance memory cell.

In some embodiments, the read period is a verify read period, and wherein the reference resistor includes polysilicon.

In some embodiments, the enable signal generation unit comprises a plurality of reference blocks generating a plurality of reference output signals, and further comprises an operator device that receives the plurality of reference output signals and that outputs the enable signal.

In some embodiments, the nonvolatile memory device further comprises an enable signal generation unit that generates the enable signal, wherein the enable signal generation unit includes: a reference resistor; a second sensing node; a second clamping unit connected between the reference resistor and the second sensing node to provide a second clamping bias to the reference resistor; a second compensation unit providing second compensation current to the second sensing node; and a second sense amplifier connected to the second sensing node to sense a level change of the second sensing node, wherein during the read period, the second clamping bias is changed over time.

In some embodiments, the first compensation current and the second compensation current are equal to each other.

In some embodiments, the first clamping bias and the second clamping bias are equal to each other.

In some embodiments, the first compensation unit adjusts an enable time point of the first sense amplifier through adjustment of a size of the first compensation current.

In some embodiments, the first clamping bias is increased in the form of a k-th order function (where, k is a natural number) over time.

In some embodiments, the first clamping bias is increased in a step form over time.

In some embodiments, a memory cell array that includes the resistance memory cell has a cross point structure.

According to an aspect of the present inventive concept, there is provided a nonvolatile memory device comprising: a resistance memory cell storing a multi-bit data; a first sensing node; a first clamping unit connected between the resistance memory cell and the first sensing node to provide a first clamping bias to the resistance memory cell; a first compensation unit providing first compensation current to the first sensing node; and a first sense amplifier connected to the first sensing node to sense a level change of the first sensing node, wherein during a read period, the first compensation current is constant, the first clamping bias is changed in process of time, and the first sense amplifier is enabled multiple times to sense the level change of the first sensing node.

In some embodiments, the first sense amplifier operates multiple times in response to an enable signal that becomes active multiple times during the read period.

In some embodiments, the nonvolatile memory device further comprises an enable signal generation unit generating the enable signal, wherein the enable signal generation unit includes a plurality of reference resistors, and an active time point of the enable signal differs to correspond to resistance values of the reference resistors, and wherein the enable signal generation unit includes a plurality of reference blocks that generate a plurality of reference output signals, and an operator device that receives the plurality of reference output signals and outputs the enable signal.

In some embodiments, the nonvolatile memory device further comprises an enable signal generation unit generating the enable signal, wherein the enable signal generation unit includes: a reference resistor; a second sensing node; a second clamping unit connected between the reference resistor and the second sensing node to provide a second clamping bias to the reference resistor; a second compensation unit that provides a second compensation current to the second sensing node; and a second sense amplifier connected to the second sensing node to sense a level change of the second sensing node, wherein during the read period, the second clamping bias is changed over time.

In some embodiments, the first compensation unit adjusts an enable time point of the first sense amplifier through adjustment of a size of the first compensation current.

In some embodiments, a memory cell array that includes the resistance memory cell has a cross point structure.

According to another aspect of the present inventive concept, there is provided a nonvolatile memory device comprising: a first sensing node, wherein a first protection current is input to the first sensing node and a cell current is output from the first sensing node; a resistance memory cell through which the cell current flows; a first sense amplifier that senses a voltage level of the first sensing node; a second sensing node, wherein a second protection current is input to the second sensing node and a reference current is output from the second sensing node; a reference resistor through which the reference current flows; and a second sense amplifier that senses a voltage level of the second sensing node, wherein in response to an output value of the second sense amplifier being transitioned in accordance with the voltage level of the second sensing node, the first sense amplifier is enabled to sense the voltage level of the first sensing node.

In some embodiments, the nonvolatile memory device further comprises a first clamping unit connected between the first sensing node and the resistance memory cell to provide a first clamping bias to the resistance memory cell, wherein the first clamping bias is increased over time.

In some embodiments, the nonvolatile memory device further comprises a second clamping unit connected between the second sensing node and the reference resistor to provide a second clamping bias to the reference resistor, wherein the second clamping bias is increased over time.

According to another aspect of the present inventive concept, there is provided a nonvolatile memory device comprising: a first clamping unit connected between a resistance memory cell and a first sensing node to provide a first clamping bias, which is increased over time, to the resistance memory cell; a second clamping unit connected between a reference resistor and a second sensing node to provide a second clamping bias, which is increased over time, to the reference resistor; a second sense amplifier sensing a voltage level of the second sensing node and outputting a reference output signal; an operator device outputting an enable signal based on the reference output signal; and a first sense amplifier sensing a voltage level of the first sensing node in response to the enable signal.

In some embodiments, the nonvolatile memory device further comprises a compensation unit providing the same compensation current to the first sensing node and the second sensing node.

According to another aspect of the present inventive concept, there is provided a nonvolatile memory device comprising: a resistance memory cell; first to n-th (where, n is a natural number) reference blocks generating first to n-th reference output signals, wherein the k-th (where $1 \leq k \leq n$) reference block includes: a k-th reference resistor; a k-th sensing node; a k-th clamping unit connected between the k-th reference resistor and the k-th sensing node to provide a clamping bias, which is increased in process to of time, to the k-th reference resistor; a k-th compensation unit providing compensation current to the k-th sensing node; and a k-th sense amplifier sensing a level change of the k-th sensing node and providing a k-th reference output signal; and a main sense amplifier that is enabled n times on the basis of the first to n-th reference output signals to read a resistance value of the resistance memory cell.

According to another aspect of the present inventive concept, there is provided a nonvolatile memory device comprising: a resistance memory cell that stores at least one of first data and second data; a sensing node; a clamping unit connected between the resistance memory cell and the sensing node and that provides a clamping bias to the resistance memory cell; and a sense amplifier that senses a level change of the sensing node, wherein in a first mode of operation, the first data is stored in the resistance memory cell and a first output value of the sense amplifier transitions to a different state after a first amount of time from a time point from where the clamping bias begins, and wherein in a second mode of operation, the second data that is different from the first data is stored in the resistance memory cell and a second output value of the sense amplifier transitions to a different state after a second amount of time that is different from the first amount of time.

BRIEF DESCRIPTION OF THE DRAWINGS

The above and other objects, features and advantages of the present inventive concept will be more apparent from the following detailed description taken in conjunction with the accompanying drawings, in which:

FIG. 1A is a block diagram illustrating features of a nonvolatile memory device according to some embodiments of the present inventive concept;

DETAILED DESCRIPTION OF THE EMBODIMENTS

Figure 1B:
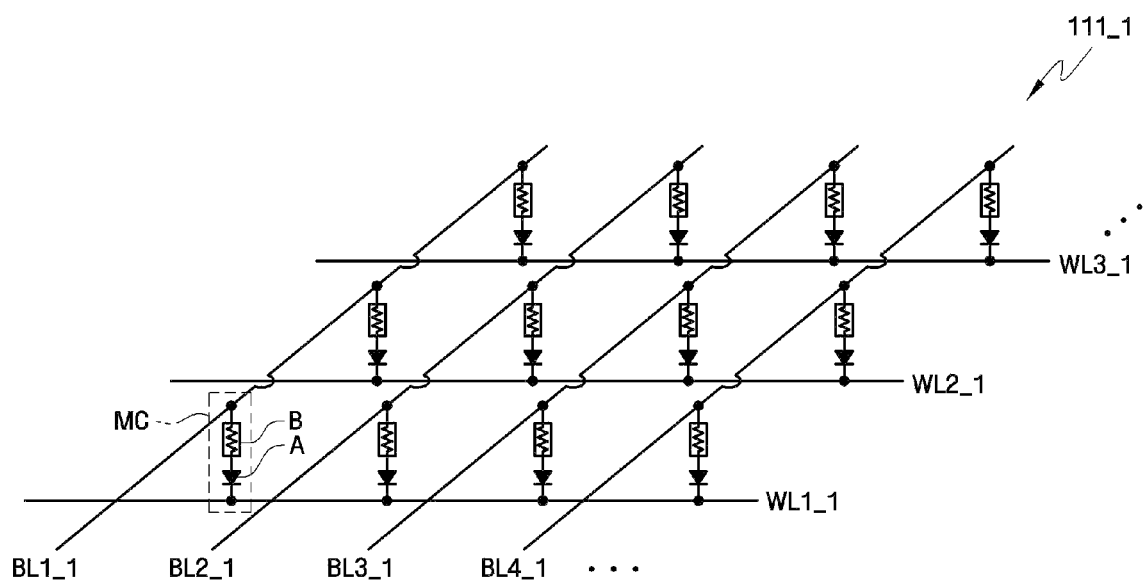
FIGS. 1B and 1C are views illustrating features of a memory cell array of FIG. 1A.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present inventive concept will be described using a phase change random access memory (PRAM). However, it will be apparent to those skilled in the art to which the present inventive concept pertains that the present inventive concept can be applied to all nonvolatile memory devices using a resistance material, such as a resistive RAM (RRAM) and a magnetic RAM (MRAM).

FIG. 1A is a block diagram illustrating features of a nonvolatile memory device according to some embodiments of the present inventive concept. In FIG. 1A, for convenience of explanation, a nonvolatile memory device is shown as being composed of 16 memory banks. However, the present inventive concept is not limited thereto.

Referring to FIG. 1A, a nonvolatile memory device according to embodiments of the present inventive concept includes a memory cell array, a plurality of sense amplifiers and write drivers (SA/WD) 2_1 to 2_8, and a peripheral circuit region, or periphery 3.

The memory cell array may include, but not be limited to, a plurality of memory banks 1_1 to 1_16. Each of the memory banks 1_1 to 1_16 may include a plurality of memory blocks BLK0 to BLK7. Each of the memory blocks BLK0 to BLK7 may include a plurality of nonvolatile memory cells arranged in a matrix form. In some embodiments, the memory blocks BLK0 to BLK7 are arranged in an 8×8 array, but are not limited thereto.

Although not illustrated in detail, the nonvolatile memory device can include a row selection circuit and a column selection circuit, which designate rows and columns of a resistance memory cell to be written/read corresponding to the memory banks 1_1 to 1_16.

Each sense amplifier and write driver 2_1 to 2_8 is arranged to correspond to two memory banks of the plurality of memory banks 1_1 to 1_16, and perform read and write operations in the corresponding memory bank. In the embodiments of the present inventive concept, it is exemplified that each sense amplifiers and write driver 2_1 to 2_8 corresponds to two memory banks 1_1 to 1_16, but are not limited thereto. That is, each sense amplifiers and write driver 2_1 to 2_8 may be arranged to correspond to one or four memory banks.

In the peripheral circuit region 3, a plurality of logic circuit blocks may be arranged for operating the column selection circuit, the row selection circuit, the sense amplifiers and write drivers 2_1 to 2_8 and a voltage generator.

Figure 1C:
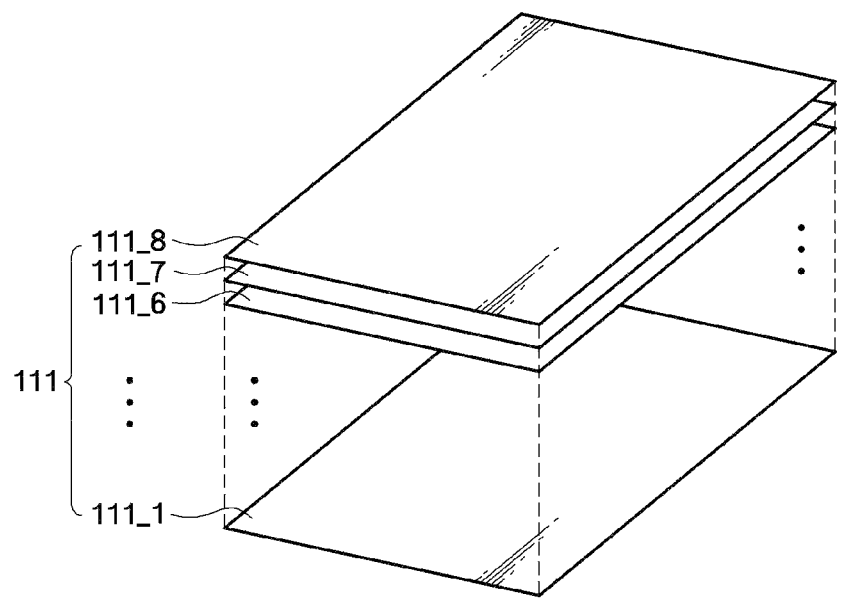

FIGS. 1B and 1C are views illustrating features of a memory cell array of FIG. 1A.

Referring to FIG. 1B, the memory cell array may have a crosspoint structure. The crosspoint structure can be a structure in which one memory cell is formed in a region where two lines cross each other. For example, bit lines BL1_1 to BL4_1 may be formed to extend in a first direction and word lines WL1_1 to WL3_1 may be formed to extend in a second direction so that the word lines WL1_1 to WL3_1 cross the bit lines BL1_1 to BL4_1. Resistance memory cells MC may be formed in regions where the bit lines BL1_1 to BL4_1 and the word lines WL1_1 to WL3_1 cross each other.

As illustrated in FIG. 1C, the memory cell array may have a three-dimensional (3D) laminated structure. The 3D laminated structure means a form in which a plurality of memory cell layers 111_1 to 111_8 are vertically laminated. In the drawing, it is exemplified that 8 memory cell layers 111_1 to 111_8 are laminated, but the present inventive concept is not limited thereto. Here, the respective memory cell layers 111_1 to 111_8 may include a plurality of memory cell groups and/or a plurality of redundancy memory cell groups. In the case where the memory cell array has a 3D laminated structure, the respective memory cell layers 111_1 to 111_8 may have a crosspoint structure, for example, as illustrated in FIG. 1B, but are not limited thereto.

Figure 2:
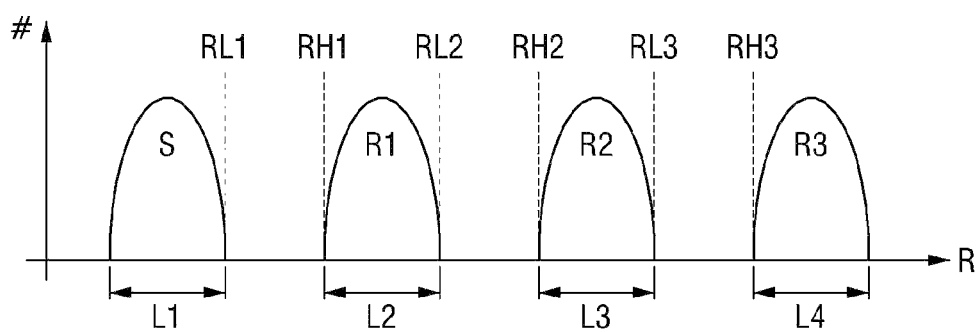
FIGS. 2 and 3 are graphical illustrations of a resistance distribution of resistance memory cells used in a nonvolatile memory device according to some embodiments of the present inventive concept.
Figure 3:
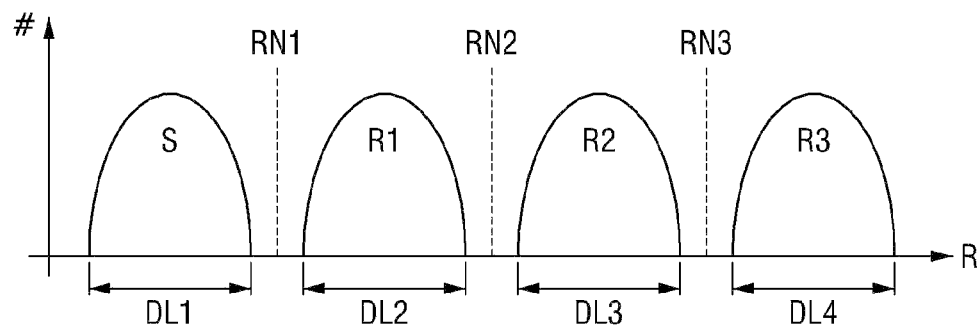

FIGS. 2 and 3 are graphical illustrations of a resistance distribution of resistance memory cells used in a nonvolatile memory device according to some embodiments of the present inventive concept.

A resistance memory cell may be a multi-bit cell. The resistance memory cell may store any one of first data to fourth data S, R1, R2, and R3. The resistance distribution in FIG. 2 may be a distribution after a write operation.

The first through fourth data S, R1, R2, R3 may correspond to first to fourth resistance levels L1, L2, L3, and L4, respectively. The first to fourth resistance levels L1, L2, L3, and L4 may have resistance values which increase according to the order of the first to fourth resistance levels L1, L2, L3, and L4. For example, the first resistance level L1 is lower than RL1, the second resistance level L2 is higher than RH1 and is lower than RL2, the third resistance level L3 is higher than RH2 and is lower than RL3, and the fourth resistance level L4 is higher than RH3. Here, RL1, RL2, RL3, RH1, RH2, and RH3 may be reference values that are used for a verify read operation for confirming whether a write has been accurately performed during a write operation.

On the other hand, the resistance distribution illustrated in FIG. 3 may be a distribution after a predetermined time elapses after a write operation. That is, the first through fourth data S, R1, R2, R3 may correspond to first to fourth resistance levels DL1, DL2, DL3, and DL4, respectively. It can be known that widths of the first to fourth resistance levels DL1, DL2, DL3, and DL4 as illustrated in FIG. 3 are increased in width in comparison to the first to fourth resistance levels L1, L2, L3, and L4 as illustrated in FIG. 2.

RN1 denotes a resistance value located between the first resistance level DL1 and the second resistance level DL2, RN2 denotes a resistance value located between the second resistance level DL2 and the third resistance level DL3, and RN3 denotes a resistance value located between the third resistance level DL3 and the fourth resistance level DL4. Here, RN1 to RN3 may be reference values that are used for a normal read operation. For example, the resistance memory cell having a resistance value that is lower than RN1 may store the first data S.

Figure 4:
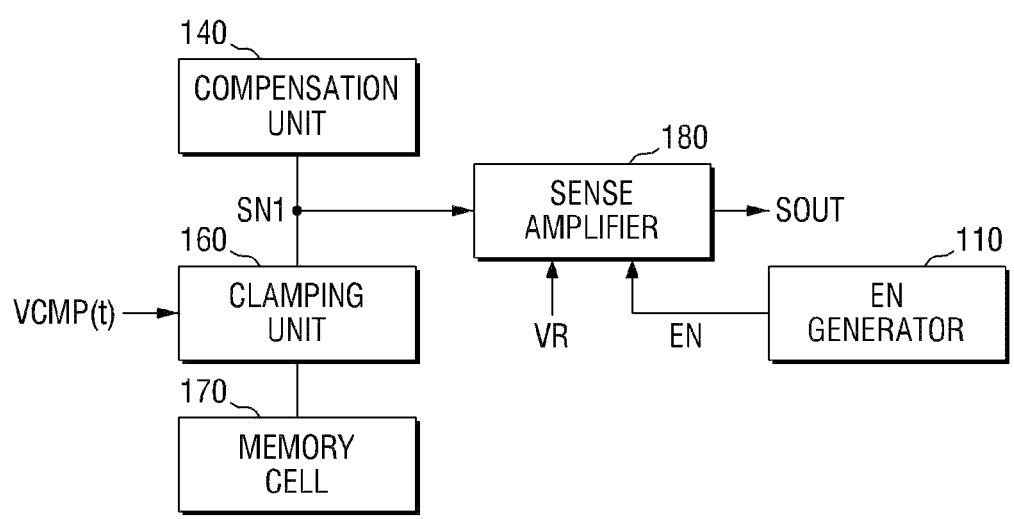
FIG. 4 is a block diagram of a nonvolatile memory device according to an embodiment of the present inventive concept.
Figure 5:
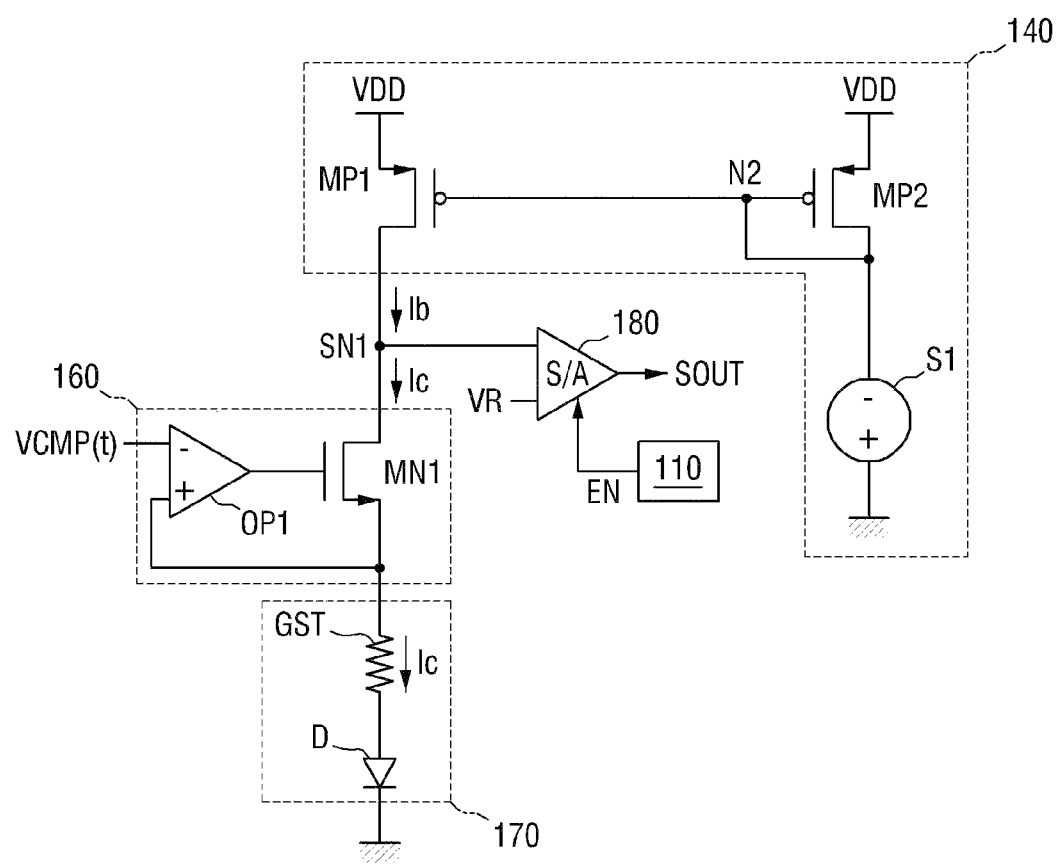
FIG. 5 is an exemplary circuit diagram of the nonvolatile memory device of FIG. 4.

FIG. 4 is a block diagram of a nonvolatile memory device according to an embodiment of the present inventive concept. FIG. 5 is a circuit diagram of the nonvolatile memory device of FIG. 4.

Referring to FIGS. 4 and 5, a nonvolatile memory device according to an embodiment of the present inventive concept may include a memory cell 170, a first sensing node SN1, a first compensation unit 140, a first clamping unit 160, a first sense amplifier 180, and an enable signal generation unit 110, or EN generator.

The memory cell 170 as illustrated can be a resistance memory cell which is selected to be read among a plurality of resistance memory cells in a memory cell array. Here, in embodiments where the resistance memory cell 170 is a PRAM, for example, shown in FIG. 5, the resistance memory cell 170 may include a variable resistance element GST having a phase change material and an access element D controlling current that flows to the variable resistance element GST. Here, the access element D may include a diode or a transistor that is connected in series to the variable resistance element GST. As the phase change materials, various kinds of materials may be used, such as GaSb, InSb, InSe, Sb2Te3, and GeTe, in which two elements are combined, GeSbTe, GaSeTe, InSbTe, SnSb2Te4, and InSbGe, in which three elements are combined, and AgInSbTe, (GeSn)SbTe, GeSb(SeTe), and Te81Ge15Sb2S2, in which four elements are combined. Among them, GeSbTe, or germanium (Ge), antimony (Sb), and tellurium (Te), may be included.

In other embodiments where the resistance memory cell 170 is an RRAM, the variable resistance element may include, for example, NiO or perovskite. The perovskite may be a composition, such as manganite ($Pr_{0.7}Ca_{0.3}MnO_3$, $Pr_{0.5}Ca_{0.5}MnO_3$, other PCMO, LCMO, and the like), titernate (STO:Cr), and zirconate (SZO:Cr, $Ca_2Nb_2O_7$:Cr, and $Ta_2O_5$:Cr). Here, a filament may be formed in the variable resistance element, and the filament becomes a current path of cell current that penetratingly flows through the resistance memory cell.

The first compensation unit 140 provides a first compensation current Ib to the first sensing node SN1. Specifically, the compensation unit 140 provides the first compensation current Ib to the first sensing node SN1 in order to compensate for a level decrease of the first sensing node SN1, which can occur due to the cell current Ic that penetratingly flows through the selected resistance memory cell 170. As illustrated in FIG. 5, the first compensation unit 140 may include a PMOS transistor MP1 connected between the power supply voltage VDD and the first sensing node SN1, a PMOS transistor MP2 connected between the power supply voltage VDD and the ground voltage, and a source S1. The two PMOS transistors MP1 and MP2 may have gates connected to each other and may be of a current mirror type.

In a nonvolatile memory device according to some embodiments of the present inventive concept, even if a multi-bit is stored in the resistance memory cell 170, the first compensation current Ib may be constant during a read period. For example, the first compensation current Ib, in response to a determination being made whether the first data (see S in FIG. 3) is stored in the resistance memory cell 170, may be equal to the first compensation current Ib in response to a determination being made whether the third data (see R2 in FIG. 3) is stored in the resistance memory cell 170.

The first clamping unit 160 is connected between the resistance memory cell 170 and the first sensing node SN1 to clamp the level of the bit line within an appropriate readable range. Specifically, the first clamping unit 160 clamps the bit line level to a predetermined level that is equal to or lower than a threshold voltage Vth of the phase change material. This is because if the bit line level becomes equal to or higher than the threshold voltage Vth, the phase of the phase change material of the selected resistance memory cell 170 may be changed. As illustrated in FIG. 5, the first clamping unit 160 may include an NMOS transistor MN1 connected between the resistance memory cell 170 and the first sensing node SN1 and an OP amplifier OP1.

In the nonvolatile memory device according to some embodiments of the present inventive concept, the first clamping unit 160 provides a first clamping bias VCMP(t) to the resistance memory cell 170. Specifically, during a read period, the first clamping bias VCMP(t) can be changed. The first clamping bias VCMP(t) may have various shapes. For example, the first clamping bias VCMP(t) may be increased during a time. Further, the first clamping bias VCMP(t) may be increased in a step form during a time, or may be increased in the form of a k-th order function (where, k is a natural number) during a time.

The first sense amplifier 180 is connected to the first sensing node SN1 to sense a level change of the first sensing node SN1. Specifically, the sense amplifier 180 compares the level of the first sensing node SN1 with a reference level VR and outputs the result of the comparison. The sense amplifier 180 may include a current sense amplifier or a voltage sense amplifier.

As described above, during a read period, the first compensation current Ib can be constant and the first clamping bias VCMP(t) can be changed during a time. In this state, a first sense slope may be enabled multiple times in response to an enable signal EN which can become active multiple times during the read period.

In the nonvolatile memory device according to some embodiments of the present inventive concept, a time when an output value SOUT of the first sense amplifier 180 is transitioned differs depending on data stored in the resistance memory cell 170.

For example, if the second data (e.g., R1) is stored in the resistance memory cell 170, an output value SOUT of the first sense amplifier 180 may be transitioned, e.g., may be transitioned from High (H) state to a Low (L) state, after a first time from a time when providing of the first clamping bias VCMP(t) begins. By contrast, if the third data (e.g., R2) that is different from the second data (e.g., R1) is stored in the resistance memory cell 170, then the output value SOUT of the first sense amplifier 180 may be transitioned after a second time that is different from the first time from the time when the providing of the first clamping bias VCMP(t) starts. A detailed explanation of an operation thereof will be described later using FIGS. 8 to 10.

The enable signal generation unit 110 may generate an enable signal EN that becomes active multiple times during the read period to control the first sense amplifier 180. The details of the enable signal generation unit 110 are described later using FIGS. 6, 7, and 11 to 13.

Figure 6:
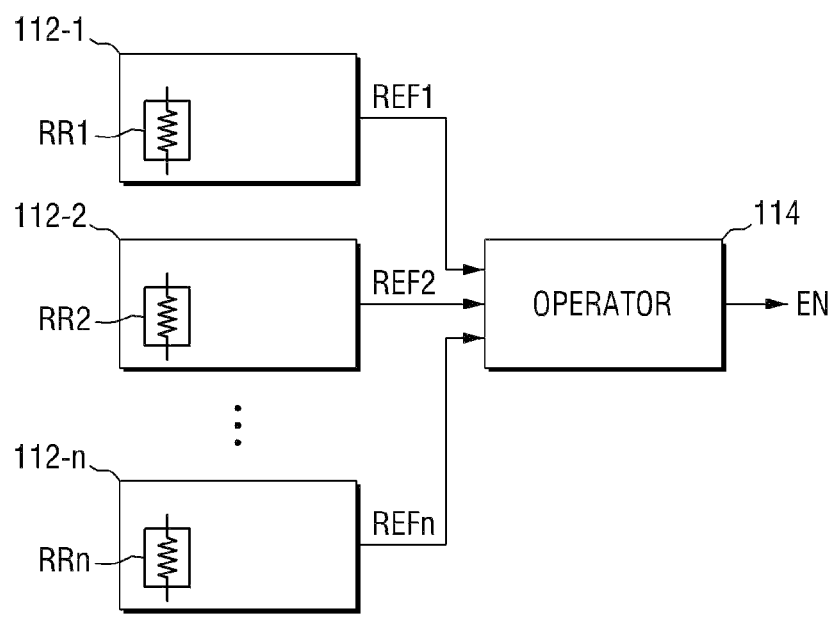
FIG. 6 is an exemplary block diagram of the enable signal generation unit of FIG. 4.
Figure 7:
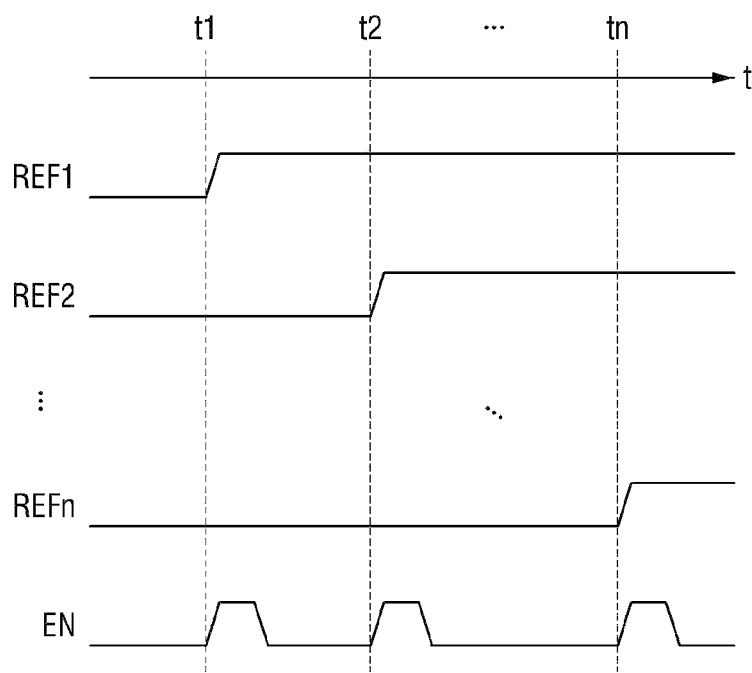
FIG. 7 is an exemplary timing diagram of the enable signal generation unit of FIG. 4.

FIG. 6 is an exemplary block diagram of the enable signal generation unit of FIG. 4. FIG. 7 is an exemplary timing diagram of the enable signal generation unit of FIG. 4.

First, referring to FIG. 6, the enable signal generation unit 110 may include a plurality of reference blocks 112_1 to 112_n (where, n is a natural number), and an operator 114.

The plurality of reference blocks 112_1 to 112_n generate a plurality of reference output signals REF1 to REFn. The plurality of reference blocks 112_1 to 112_n may include a plurality of reference resistors RR1 to RRn, respectively. The reference resistors RR1 to RRn may have different resistance values. Active time points of the reference output signals REF1 to REFn may differ to correspond to the resistance values of the reference resistors RR1 to RRn. For example, if the reference resistor (e.g., RR1) has a small resistance value, then the active time point of the reference output signal (e.g., REF 1) may become early, whereas if the reference resistor (e.g., RR2) has a high resistance value, then the active time point of the reference output signal (e.g., REF2) may become late.

The operator 114 receives the plurality of reference output signals REF1 to REFn, and generates an enable signal EN. The operator 114 may be, for example, an OR operator.

Referring to FIG. 7, the first reference output signal REF1 of the first reference block 112_1 becomes active at time t1, and the second reference output signal REF2 of the second reference block 112_2 becomes active at time t2. Further, the n-th reference output signal REFn of the n-th reference block 112_n becomes active at time tn.

Whenever the first reference output signal REF1 to the n-th reference output signal REFn become active, the enable signal EN may transition from a logic low to a logic high.

Figure 8:
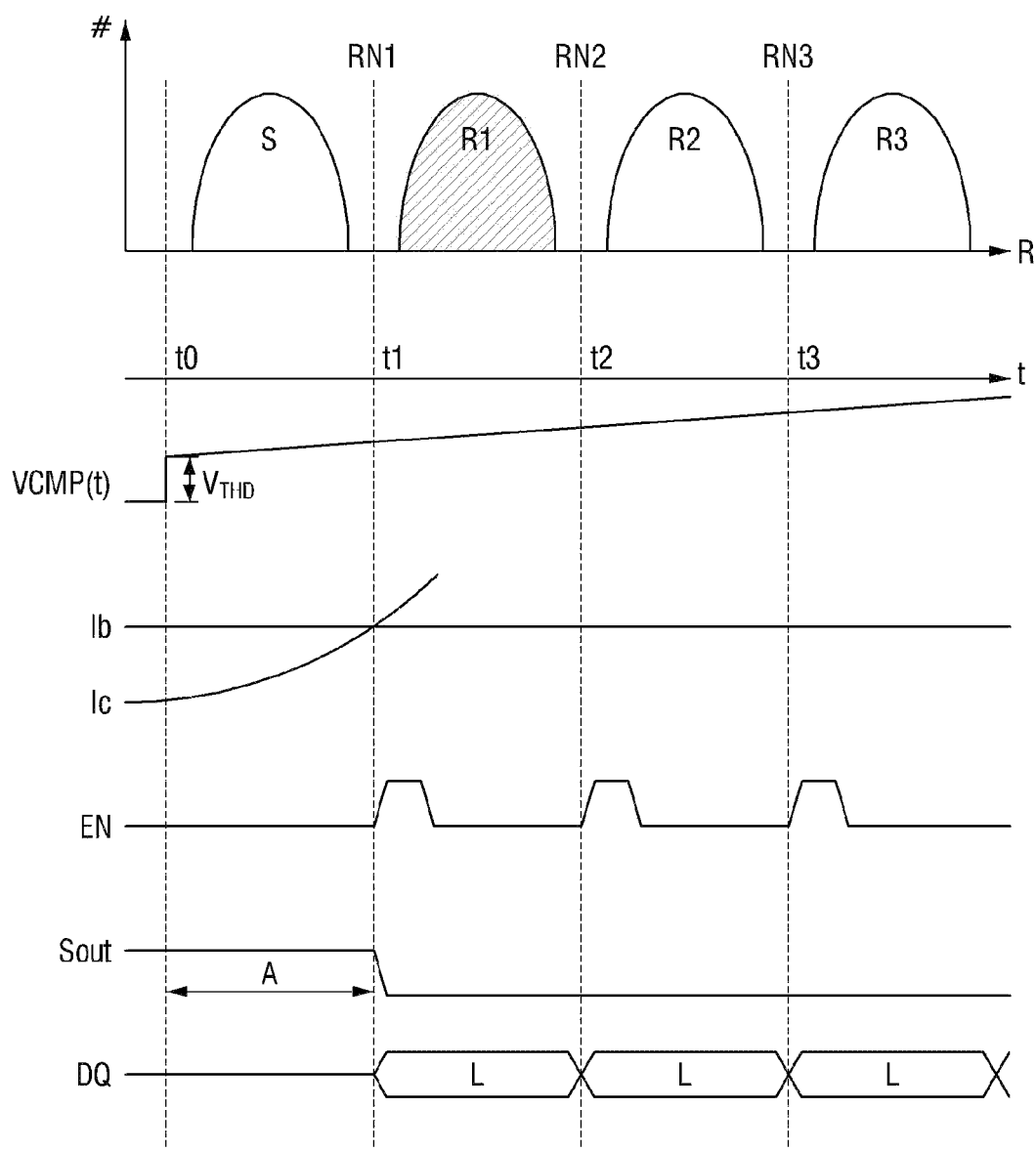
FIGS. 8 to 10 are timing diagrams illustrating a method for driving a nonvolatile memory device according to some embodiments of the present inventive concept.
Figure 9:
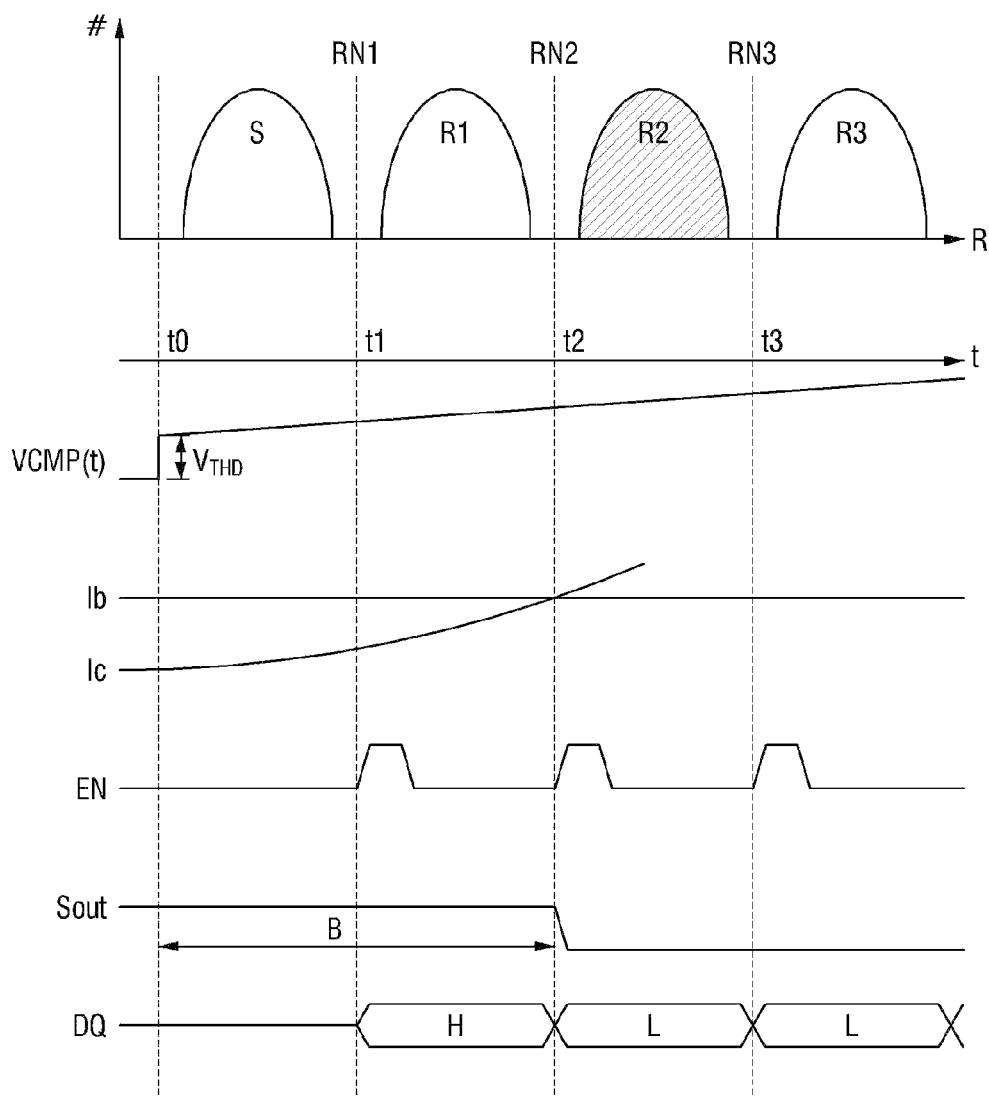
Figure 10:
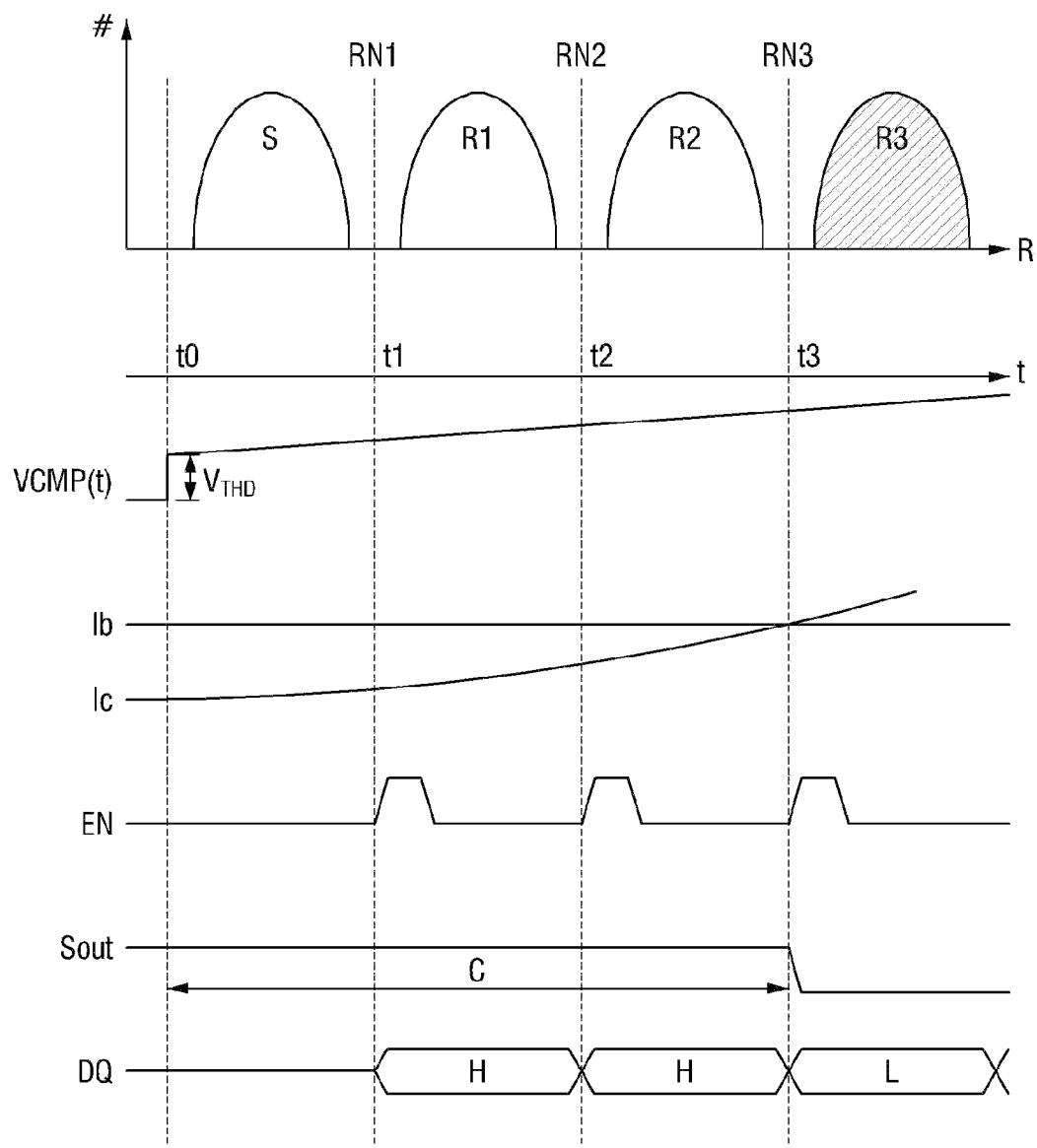

FIGS. 8 to 10 are timing diagrams illustrating a method for driving a nonvolatile memory device according to some embodiments of the present inventive concept. FIGS. 8 to 10 can illustrate elements of a normal read operation. In describing FIGS. 8 to 10, reference can be made at least to elements of the nonvolatile memory device of FIGS. 4-7.

In particular, FIG. 8 is a timing diagram illustrating a case where a second data R1 is stored in a resistance memory cell 170.

Referring to FIG. 8, a read operation starts at time t0. The first clamping bias VCMP(t) is enabled. As illustrated, the minimum value of the first clamping bias VCMP(t) may relate to a threshold voltage $V_{THD}$ of an access element D of the resistance memory cell 170. The first compensation current Ib remains constant over time, and the first clamping bias VCMP(t) is increased, for example, linearly, over time. As the first clamping bias VCMP(t) increases, the cell current Ic that penetratingly flows through the resistance memory cell 170 increases. On the other hand, if the first compensation current Ib is higher than the cell current Ic, for example, between time t0 and t1, the output value SOUT of the first sense amplifier 180 remains at a logic high.

At time t1, the cell current Ic is increased to be a high as the first compensation current Ib, and finally becomes higher than the first compensation current Ib. Accordingly, the level of the first sensing node SN1 starts to change. At this time, the enable signal EN is in an active state. The first sense amplifier 180 is enabled in response to the enable signal EN to sense the level change of the first sensing node SN1. Accordingly, the output value SOUT of the first sense amplifier 180 is transitioned from logic high to logic low. The output terminal of the first sense amplifier 180 is connected to an encoder. The encoder outputs a logic low (L) as data output DQ on in response to the output value SOUT of the first sense amplifier 180.

Here, if the second data R1 is stored in the resistance memory cell 170, then the output value SOUT of the first sense amplifier 180 transitions after the first time A from the time t0 where providing of the first clamping bias VCMP(t) starts.

At time t2, the enable signal EN becomes active again. The first sense amplifier 180 is enabled in response to the enable signal EN. The cell current Ic is increased due to the increase of the first clamping bias CVMP(t), and the cell current remains higher than the first compensation current Ib. Accordingly, the output value SOUT of the first sense amplifier 180 remains at a logic low. Further, the encoder outputs a logic low value.

At time t3, the enable signal EN becomes active again. The first sense amplifier 180 is enabled in response to the enable signal EN. The cell current Ic is increased due to the increase of the first clamping bias CVMP(t), and the cell current Ic remains higher than the first compensation current Ib. The first clamping bias VCMP(t) is increased up to the range where the phase of the phase change material of the resistance memory cell 170 is not changed. Accordingly, the output value SOUT of the first sense amplifier 180 remains at a logic low. Further, the encoder outputs a logic low value.

As a result, in the case where the second data R1 is stored in the resistance memory cell 170, the encoder can generate an output LLL.

FIG. 9 is a timing diagram in the case where third data R2 is stored in a resistance memory cell 170. Explanation of the contents that are substantially the same as those explained using FIG. 8 will be omitted for brevity.

Referring to FIG. 9, a read operation starts at time t0. The first compensation current Ib is kept constant, and the first clamping bias VCMP(t) is increased over time. As the first clamping bias VCMP(t) is increased, the cell current Ic starts to increase. However, since the first compensation current Ib is higher than the cell current Ic, the output value SOUT of the first sense amplifier 180 is kept at a logic high.

Then, even at time t1, the first compensation current Ib is higher than the cell current Ic. Accordingly, the output value SOUT of the first sense amplifier 180 is kept at a logic high.

At time t2, the cell current Ic is increased as high as the first compensation current Ib, and finally becomes higher than the first compensation current Ib. Accordingly, the level of the first sensing node SN1 starts to change. At this time, the enable signal EN is in an active state. The first sense amplifier 180 is enabled in response to the enable signal EN to sense the level change of the first sensing node SN1. Accordingly, the output value SOUT of the first sense amplifier 180 is transitioned from a logic high to a logic low. The encoder outputs a logic low (L) value as the data output DQ on the basis of the output value SOUT of the first sense amplifier 180.

Here, if the third data R2 is stored in the resistance memory cell 170, then the output value SOUT of the first sense amplifier 180 is transitioned after the second time B from the time point t0 where providing of the first clamping bias VCMP(t) starts.

At time t3, the enable signal EN becomes active. The first sense amplifier 180 is enabled in response to the enable signal EN. The cell current Ic is increased due to the increase of the first clamping bias CVMP(t), and the cell current Ic is higher than the first compensation current Ib. Accordingly, the output value SOUT of the first sense amplifier 180 is at a logic low. Further, the encoder outputs a logic low value.

As a result, in the case where the third data R2 is stored in the resistance memory cell 170, the encoder can output a value HLL.

FIG. 10 is a timing diagram in the case where the fourth data R3 is stored in the resistance memory cell 170. An explanation of the contents that are substantially the same as those explained using FIG. 8 will be omitted for brevity.

Referring to FIG. 10, a read operation starts at time t0. The first compensation current Ib is kept constant, and the first clamping bias VCMP(t) is increased over time. As the first clamping bias VCMP(t) is increased, the cell current Ic starts to increase.

Then, even at time t1 and at time t2, the first compensation current Ib is higher than the cell current Ic. Accordingly, the output value SOUT of the first sense amplifier 180 is at a logic high.

Then, at time t3, the cell current Ic is increased as high as the first compensation current Ib, and finally becomes higher than the first compensation current Ib. Accordingly, the level of the first sensing node SN1 starts to change. At this time, the enable signal EN is in an active state. The first sense amplifier 180 is enabled in response to the enable signal EN to sense the level change of the first sensing node SN1. Accordingly, the output value SOUT of the first sense amplifier 180 is transitioned from a logic high to a logic low. The encoder outputs a logic low (L) value as the data output DQ in response to the output value SOUT of the first sense amplifier 180.

Here, if the fourth data R3 is stored in the resistance memory cell 170, the output value SOUT of the first sense amplifier 180 is transitioned after a third time C from the time point t0 where providing of the first clamping bias VCMP(t) starts.

As a result, in the case where the fourth data R3 is stored in the resistance memory cell 170, the encoder can output an HHL value.

Here, referring to FIGS. 8 to 10, according to the nonvolatile memory device according to some embodiments of the present inventive concept, the transition time of the output value SOUT of the first sense amplifier 180 can differ depending on the data stored in the resistance memory cell 170, see, for example, A in FIG. 8, B in FIG. 9, and C in FIG. 10.

Further, the encoder that is connected to the output terminal of the first sense amplifier 180 outputs different logic values depending on the data stored in the resistance memory cell 170. That is, a value such as LLL, HLL, HHL, or HHH may be output depending on the data stored in the resistance memory cell.

As described above with reference to FIGS. 8 to 10, during a normal read operation, the enable signal EN becomes active at the time when the level of the first sensing node SN1 is changed. In order to generate the enable signal EN, the resistance memory cell may be used as reference resistors RR1 to RRn of the enable signal generation unit 110. In particular, during the normal read operation, the reference resistors RR1 to RRn may be used as the resistance memory cell, but are not limited thereto. As described above with reference to FIGS. 2 and 3, if a predetermined time elapses after the write operation, the resistance memory cell 170 may be deteriorated and the resistance value of the memory cell 170 may be changed. Accordingly, in order to make the enable signal EN active in consideration of such a change, the resistance memory cell may be used as the reference resistors RR1 to RRn. A reference block that includes a resistance memory cell in accordance with an embodiment is described with reference to FIG. 11.

Figure 11:
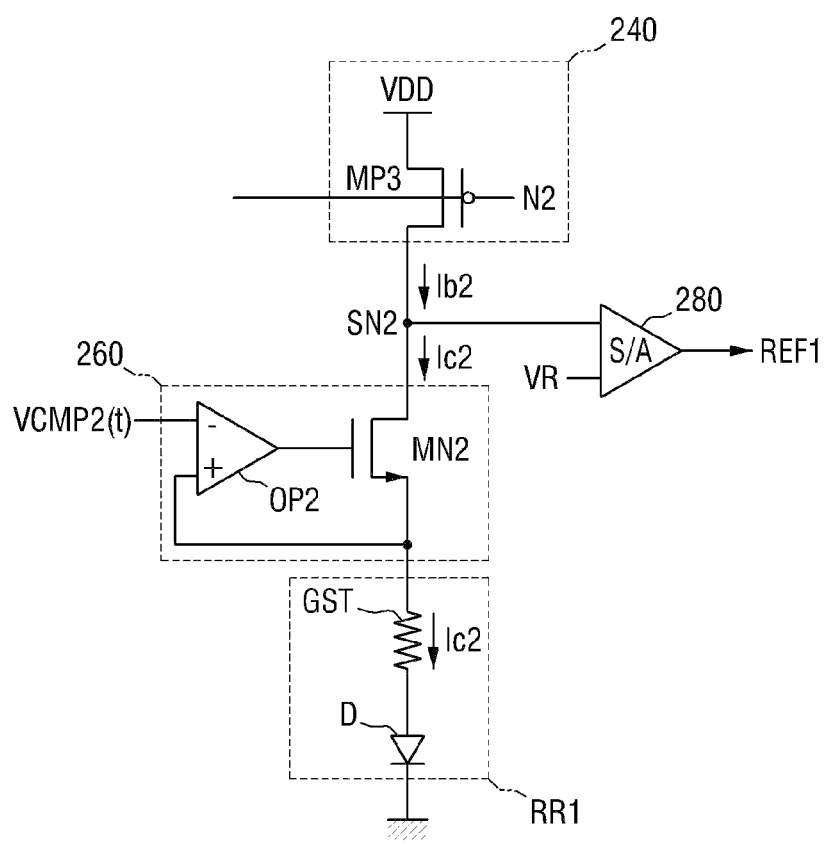
FIG. 11 is an exemplary circuit diagram of a reference block of FIG. 6.

FIG. 11 is an exemplary circuit diagram of a reference block of FIG. 6.

Referring to FIG. 11, the reference block (e.g., 112_1) may include reference resistors RR1 to RRn, a second sensing node SN2, a second clamping unit 260, a second compensation unit 240, and a second sense amplifier 280.

A reference resistor (e.g., RR1) may have the same configuration as the resistance memory cell 170 described herein. That is, the reference resistor RR1 may include a variable resistor element GST having a phase change material and an access element D controlling current that flows to the variable resistor element GST.

The second compensation unit 240 may provide second compensation current Ib2 to the second sensing node SN2. The second compensation unit 240 includes a PMOS transistor MP3 connected between the power supply voltage VDD and the second sensing node SN2, and the gate of the PMOS transistor MP3 is connected to the node N2 of the first compensation unit 140. That is, the PMOS transistors MP1 and MP2 of the first compensation unit 140 and the PMOS transistor MP3 of the second compensation unit 240 may be coupled to the same node. Accordingly, the first compensation current Ib and the second compensation current Ib2 may be the same or similar. That is, while the data, which is stored in the resistance memory cell 170 in which the multi-bit is stored, is read, the first compensation current Ib and the second compensation current Ib2 may be constant.

The second clamping unit 260 is connected between the reference resistor RR1 and the second sensing node SN2. The second clamping unit 260 may include an NMOS transistor MN2 and an OP amplifier OP2. Here, the second clamping unit 260 provides a second clamping bias VCMP2 (t) to the reference resistors RR1 to RRn. The second clamping bias VCMP2 (t) can change over time during the read period. The second clamping bias VCMP2 (t) may be equal to the first clamping bias VCMP(t). For example, like the first clamping bias VCMP(t), the second clamping bias VCMP2(t) may increased over time. The second clamping bias VCMP2(t) may be increased in a step form over time, or may be increased in the form of a k-th order function (where, k is a natural number) over time.

However, the first clamping bias VCMP(t) and the second clamping bias VCMP2(t) are not necessarily equal to each other. The first clamping bias VCMP(t) and the second clamping bias VCMP2(t) may be separately generated and/or controlled.

The second sense amplifier 280 is connected to the second sensing node SN2 to sense the level change of the second sensing node SN2. Specifically, the second sense amplifier 280 compares the level of the second sensing node SN2 with a reference level VR, and outputs a reference output signal REF1.

Figure 12:
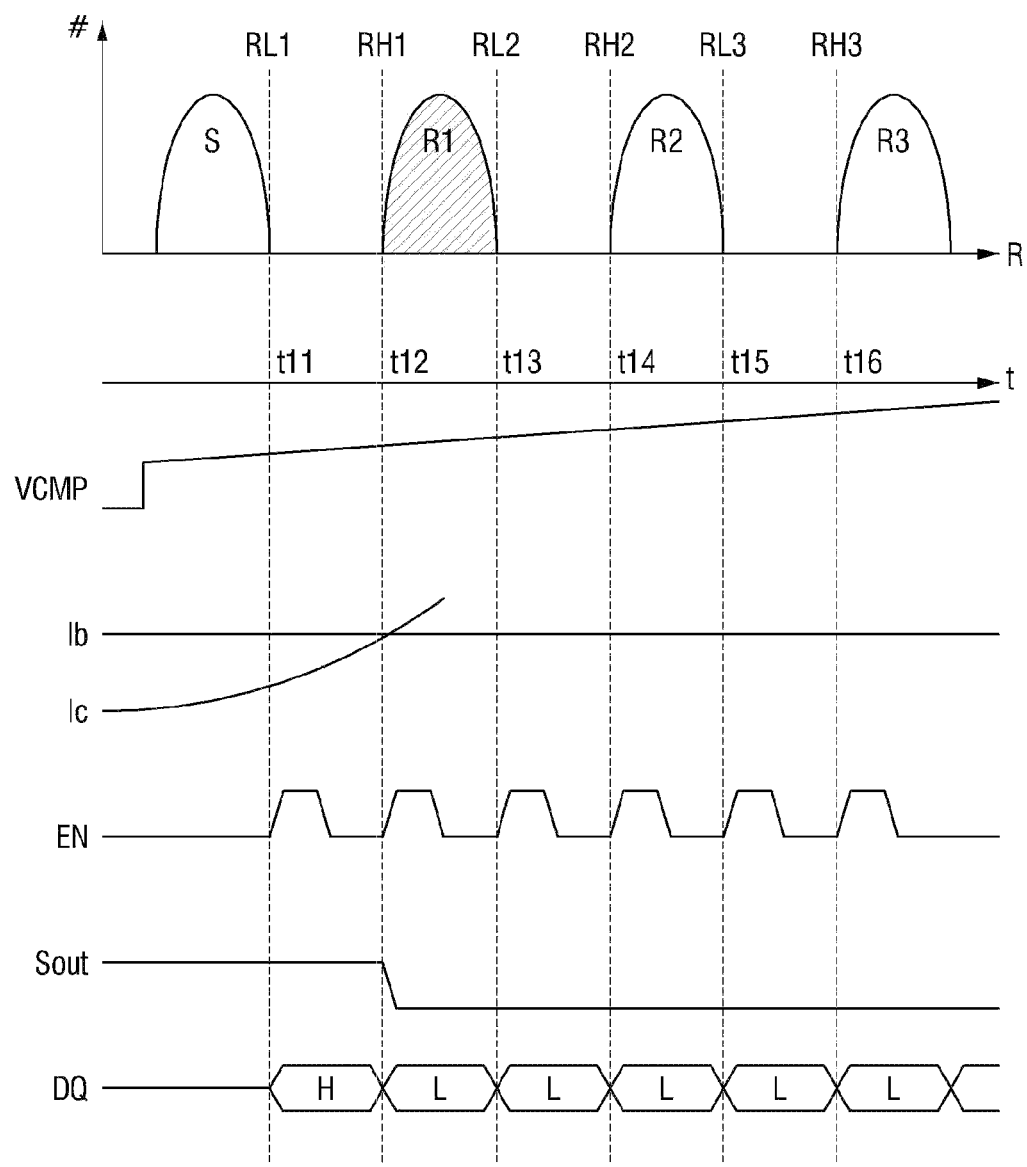
FIG. 12 is a timing diagram illustrating a method for driving a nonvolatile memory device according to some embodiments of the present inventive concept.

FIG. 12 is a timing diagram illustrating a method for driving a nonvolatile memory device according to some embodiments of the present inventive concept. FIG. 12 can refer to a verify read operation or the like.

FIG. 12 exemplarily illustrates a confirmation of whether a resistance value of the resistance memory cell 170 is higher than RH1 after the second data R1 is written in the resistance memory cell 170. Although not separately explained, those skilled in the art to which the present inventive concept pertains can easily analogize a method of comparing the resistance value of the resistance memory cell 170 with RL1, RL2, RH2, RL3, and RH3 as described herein.

Referring to FIG. 12, at time t12, the cell current Ic is increased to be at least as high as the first compensation current Ib, and finally becomes higher than the first compensation current Ib. Accordingly, the level of the first sensing node SN1 starts to change. At this time, the enable signal EN is in an active state. The first sense amplifier 180 is enabled in response to the enable signal EN to sense the level change of the first sensing node SN1. Accordingly, the output value SOUT of the first sense amplifier 180 is transitioned from a logic high to a logic low. The encoder outputs a logic low (L) value as the data output DQ on the basis of the output value SOUT of the first sense amplifier 180.

Figure 13:
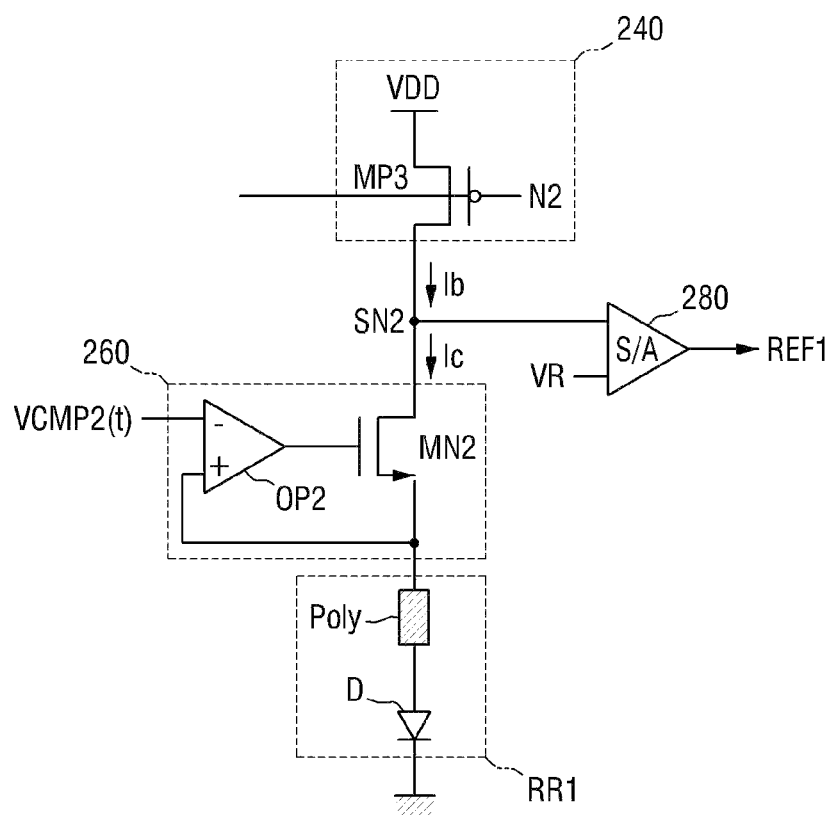
FIG. 13 is another exemplary circuit diagram of a reference block of FIG. 6.

FIG. 13 is another exemplary circuit diagram of a reference block of FIG. 6. For convenience in explanation, explanation will be made around the point that is different from that explained using FIG. 11.

Referring to FIG. 13, polysilicon may be used for the reference resistor (e.g., RR1) of the enable signal generation unit 110. As described above with reference to FIG. 12, during the verify read operation, the enable signal EN is made active at a time when the level of the first sensing node SN1 is changed. However, the verify read operation is performed just after the write operation. Accordingly, the resistance value of the resistance memory cell 170 is not easily shifted. Accordingly, polysilicon of a fixed resistor may be used as the reference resistor RR1. Further, the resistance memory cell or other materials may also be used for the reference resistor RR1.

Referring to FIG. 11, the reference block (e.g., 112_1) may include reference resistors RR1 to RRn, a second sensing node SN2, a second clamping unit 260, a second compensation unit 240, and a second sense amplifier 280.

Figure 14:
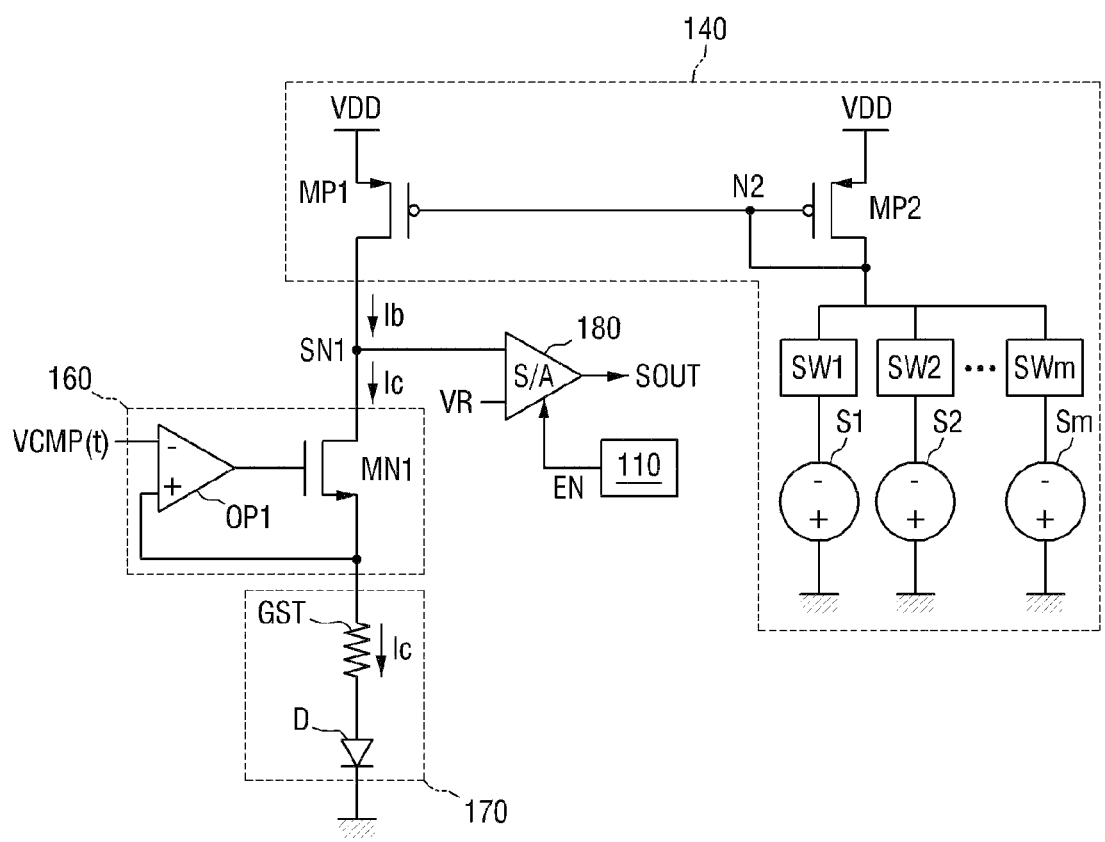
FIG. 14 is a circuit diagram of a nonvolatile memory device according to another embodiment of the present inventive concept.
Figure 15:
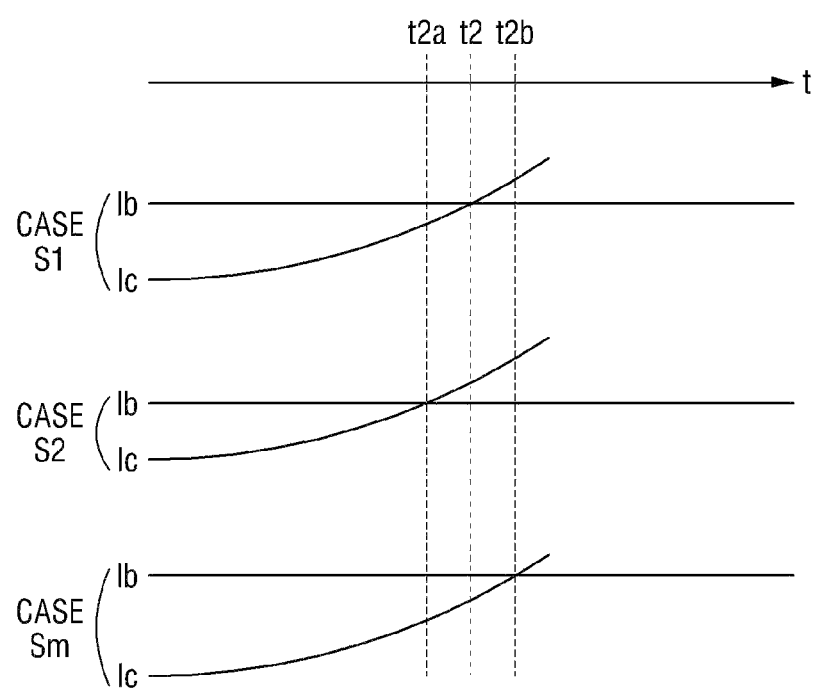
FIG. 15 is a timing diagram illustrating a method for driving the nonvolatile memory device of FIG. 14.

FIG. 14 is a circuit diagram illustrating a nonvolatile memory device according to another embodiment of the present inventive concept. FIG. 15 is a timing diagram illustrating a method for driving the nonvolatile memory device of FIG. 14. For convenience in explanation, a description is made around a different point than that explained in the description of FIGS. 4 and 5.

Referring to FIG. 14, in the nonvolatile memory device according to another embodiment of the present inventive concept, a first compensation unit 140 may adjust an enable time of a first sense amplifier 180 via an adjustment of the first compensation current Ib.

The first compensation unit 140 includes PMOS transistors MP1 and MP2, a plurality of switches SW1 to SWm (where, m is a natural number that is equal to or larger than 2), and a plurality of sources S1 to Sm. By activating at least one of the plurality of switches SW1 to SWm, at least one of the plurality of sources S1 to Sm can be selected. Accordingly, the current amount of the first compensation current Ib can be adjusted.

Here, referring to FIG. 15, a case where a third data R2 is stored in the resistance memory cell 170 will be described.

If the source S1 is selected (CASE S1), a cell current Ic may be higher than the first compensation current Ib at time t2.

By contrast, if the source S2 is selected (CASE S2), the cell current Ic may be higher than the first compensation current Ib at time t2a. That is, in the case where the source S2 is selected, the enable time of the first sense amplifier 180 may become earlier than that in the case where the source S1 is selected.

If the source S3 is selected (CASE S3), the cell current Ic may be higher than the first compensation current Ib at time t2b. That is, in the case where the source S3 is selected, the enable time of the first sense amplifier 180 may be later than that a case where the source S1 is selected.

As described above, by adjusting the current amount of the first compensation current Ib, an enable time of the first sense amplifier 180 can be adjusted. That is, the sensing time can be adjusted.

Figure 16:
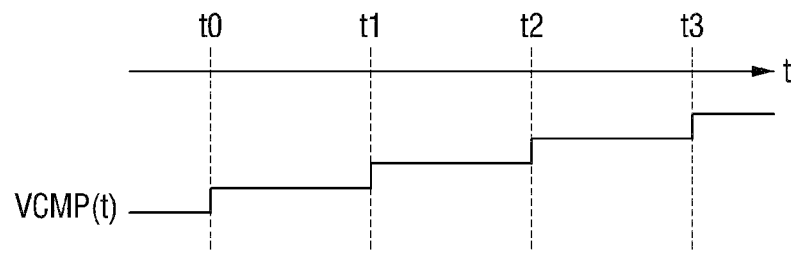
FIGS. 16 to 18 are diagrams of examples of the first clamping bias that can be used in the nonvolatile memory device according to some embodiments of the present inventive concept.
Figure 17:
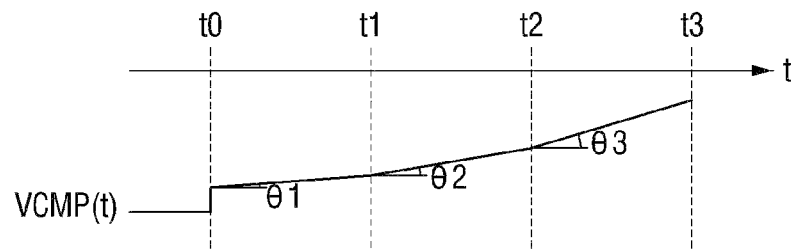
Figure 18:
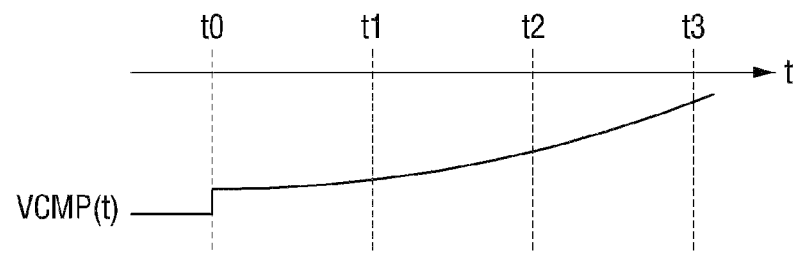

FIGS. 16 to 18 are diagrams illustrating examples of a first clamping bias that can be used in the nonvolatile memory device according to some embodiments of the present inventive concept.

As shown in FIG. 16, the first clamping bias VCMP(t) may be increased in a step form over time.

As shown in FIG. 17, the first clamping bias VCMP(t) may have different slopes by periods. For example, the slope of the first clamping bias VCMP(t) between to and t1 may be θ1, the slope of the first clamping bias VCMP(t) between t1 and t2 may be θ2, and the slope of the first clamping bias VCMP(t) between t2 and t3 may be θ3. θ1 may be larger than θ2, and θ2 may be larger than θ3, but are not limited thereto.

As shown in FIG. 18, the first clamping bias VCMP(t) may be increased in the form of a k-th order function (where, k is a natural number) over time. FIG. 18 exemplarily illustrates that the first clamping bias VCMP(t) is increased in the form of a second order function, but is not limited thereto.

FIGS. 19 to 23 are diagrams illustrating a memory system according to some embodiments of the present inventive concept. Here, FIGS. 19 to 23 can relate to a memory system that uses a nonvolatile memory device according to embodiments of the present inventive concept.

Figure 19:
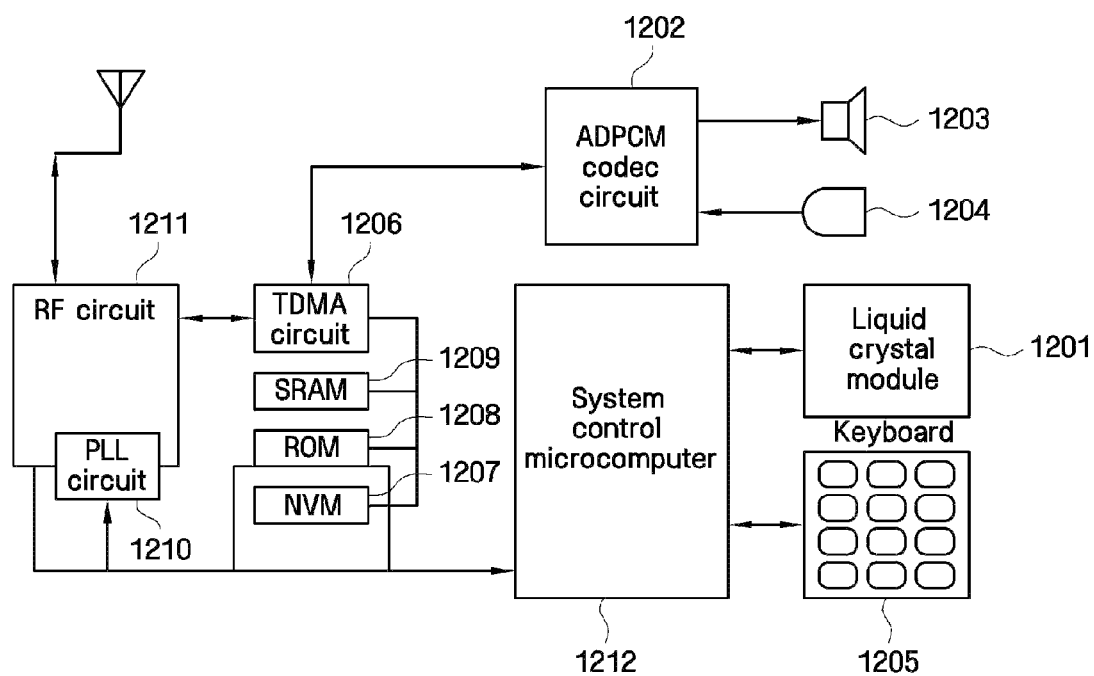
FIG. 19 is an exemplary diagram of a cellular phone system using a nonvolatile memory device according to the embodiments of the present inventive concept.

FIG. 19 is an exemplary diagram of a cellular phone system using a nonvolatile memory device according to the embodiments of the present inventive concept.

Referring to FIG. 19, the cellular phone system includes a compression or decompression ADPCM codec circuit 1202, a speaker 1203, a microphone 1204, a TDMA circuit 1206 for time-division-multiplexing digital data, a PLL circuit 1210 setting a carrier frequency of a wireless signal, and an RF circuit 1211 for transferring or receiving the wireless signal.

Further, the cellular phone system may include but not be limited to various kinds of memory devices, and for example, may include a nonvolatile memory device 1207, a ROM 1208, and an SRAM 1209. The nonvolatile memory device 1207 may be a nonvolatile memory device according to the embodiments of the present inventive concept, and may store, for example, ID numbers. The ROM 1208 may store programs, and the SRAM 1209 may serve as a workspace for a system control microcomputer 1212 or may temporarily store data. Here, the system control microcomputer 1212 may be a processor which can control write and read operations of the nonvolatile memory device 1207.

Figure 20:
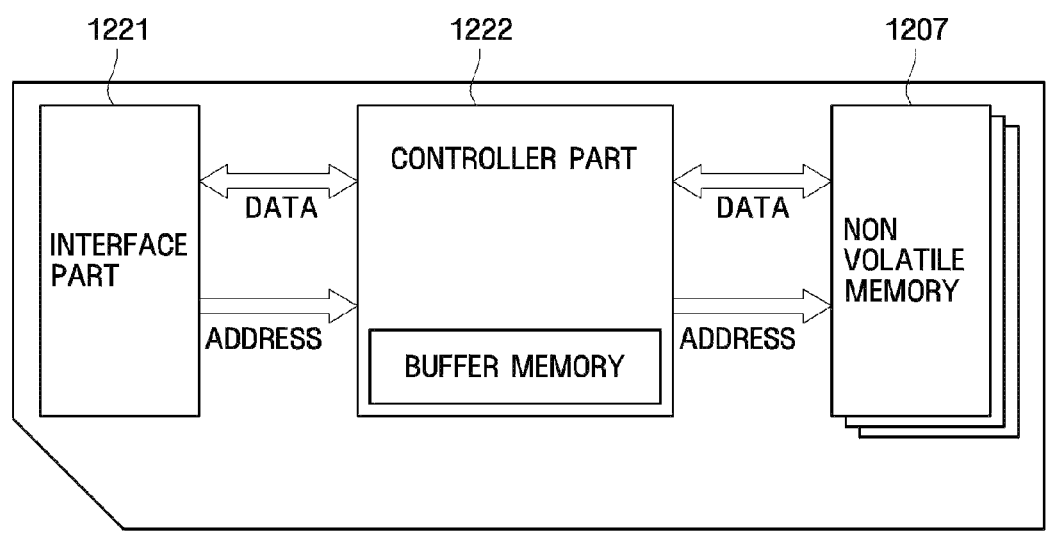
FIG. 20 is an exemplary diagram of a memory card using a nonvolatile memory device according to the embodiments of the present inventive concept.

FIG. 20 is an exemplary diagram of a memory card using a nonvolatile memory device according to the embodiments of the present inventive concept. The memory card may be, for example, an MMC card, an SD card, a multiuse card, a micro SD card, a memory stick, a compact SD card, an ID card, a PCMCIA card, a SSD card, a chip card, a smart card, or a USB card.

Referring to FIG. 20, the memory card may include at least one of an interface part 1221 performing an interface with an outside, a controller 1222 having a buffer memory and controlling the operation of the memory card, and a nonvolatile memory device according to the embodiments of the present inventive concept. The controller 1222 is a processor which can control write and read operations of the nonvolatile memory device 1207. Specifically, the controller 1222 is coupled to the nonvolatile memory device 1207 and the interface part 1221 through a data bus DATA and an address bus ADDRESS.

Figure 21:
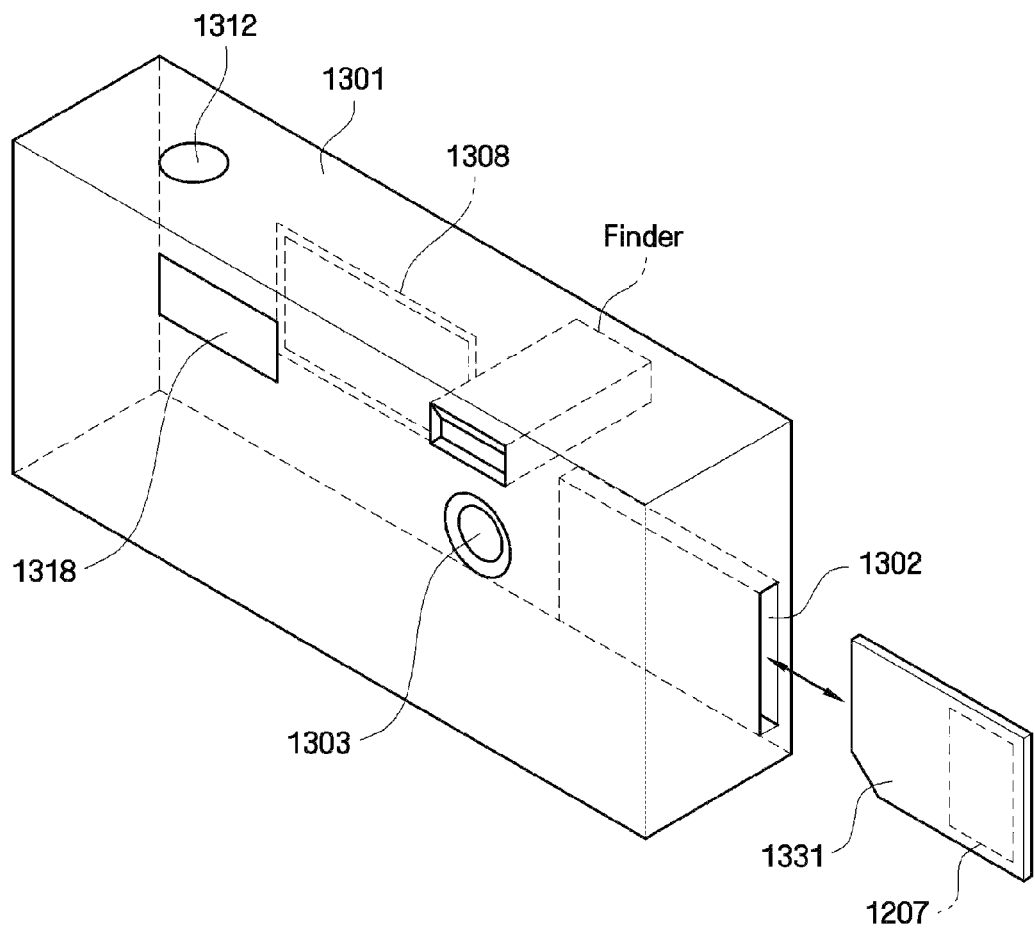
FIG. 21 is an exemplary view of a digital still camera using a nonvolatile memory device according to the embodiments of the present inventive concept.

FIG. 21 is a view of a digital still camera using a nonvolatile memory device according to the embodiments of the present inventive concept.

Referring to FIG. 21, the digital still camera includes a body 1301, a slot 1302, a lens 303, a display unit 1308, a shutter button 1312, and a strobe 1318. In particular, a memory card 1331 may be inserted into the slot 1308, and the memory card 1331 may include at least one nonvolatile memory device 1207 according to embodiments of the present inventive concept.

If the memory card 1331 is of a contact type, the memory card 1331 comes in electrical contact with a specific electrical circuit on a circuit board when the memory card 1331 is inserted into the slot 1308. If the memory card 1331 is of a non-contact type, the memory card 1331 performs communications via a wireless signal.

Figure 22:
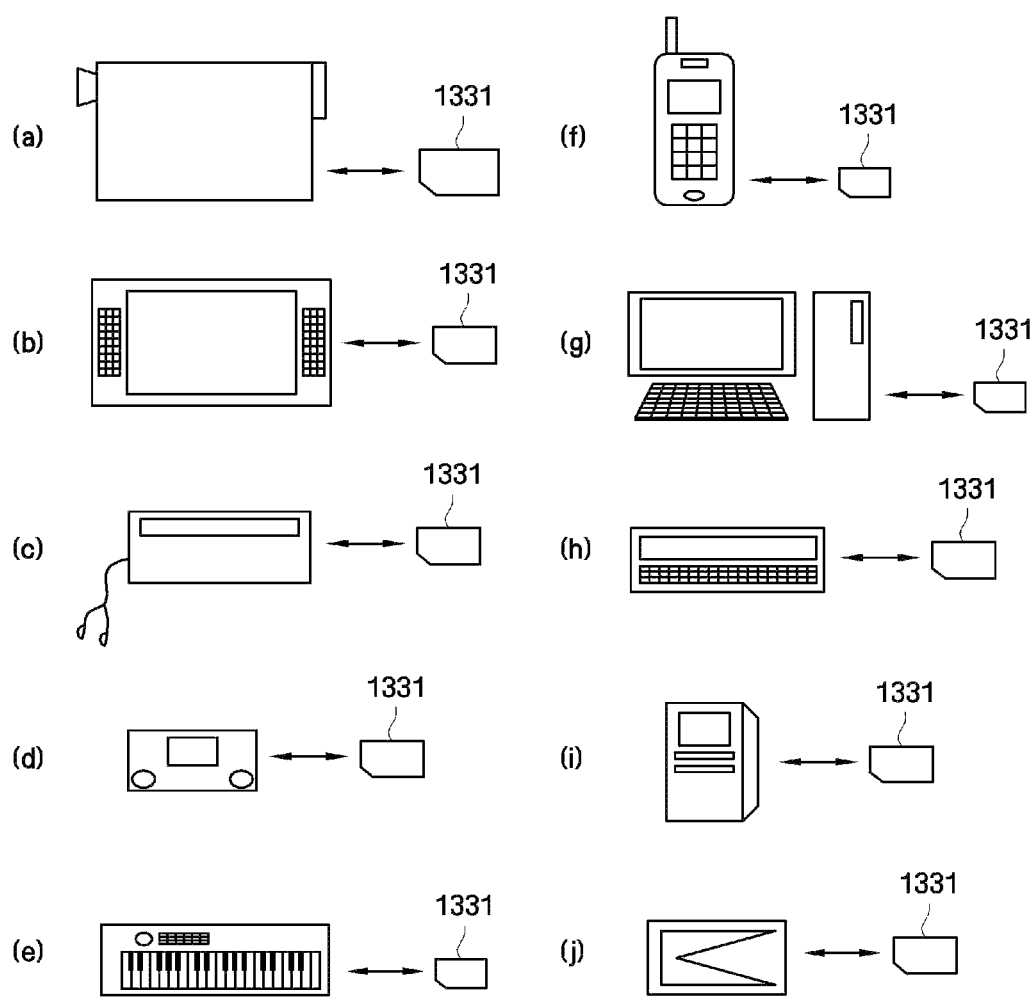
FIG. 22 is an exemplary view of various systems using the memory card of FIG. 20.

FIG. 22 is a view of various systems using the memory card of FIG. 20.

Referring to FIG. 22, the memory card 331 may be used in electronic devices such as (a) a video camera, (b) a television receiver, (c) an audio device, (d) a game machine, (e) an electronic music device, (f) a cellular phone, (g) a computer, (h) a PDA (Personal Digital Assistant), (i) a voice recorder, or (j) a PC card.

Figure 23:
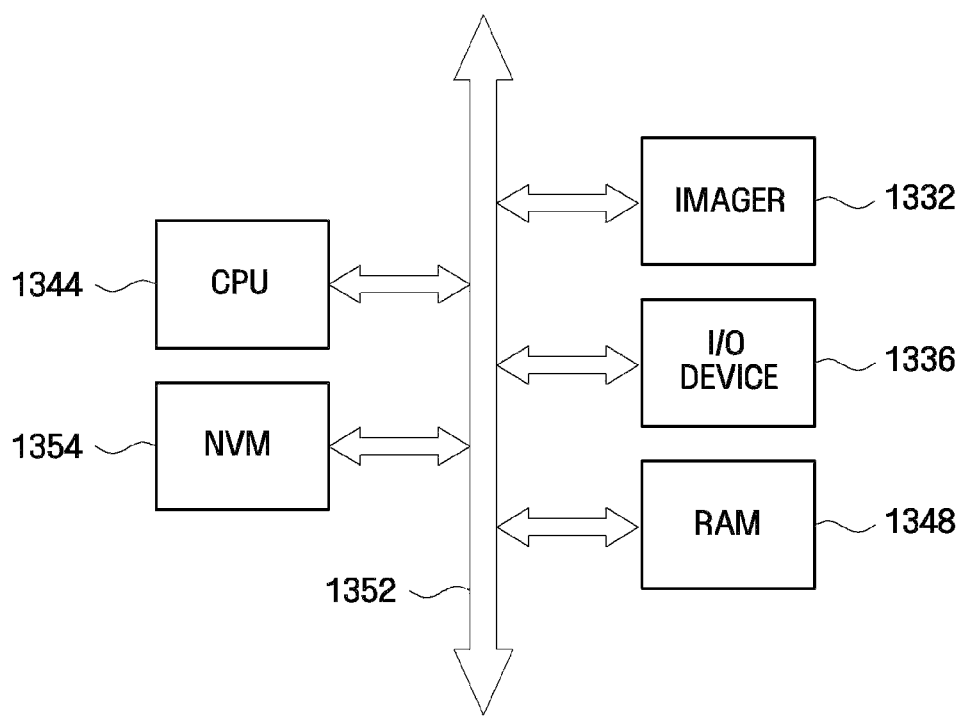
FIG. 23 is an exemplary diagram of an image sensor system using a nonvolatile memory device according to embodiments of the present inventive concept.

FIG. 23 is a diagram of an image sensor system using a nonvolatile memory device according to embodiments of the present inventive concept.

Referring to FIG. 23, an image sensor system may include an image sensor 1332 or imager, an input/output device 1336, a RAM 1348, a CPU 1344, and a nonvolatile memory (NVM) device 1354 according to embodiments of the present inventive concept. The respective constituent elements, that is, the image sensor 1332, the input/output device 1336, the RAM 1348, the CPU 1344, and the NVM device 1354 communicate with each other through a bus 1352. The image sensor 1332 may include a photo sensing element, such as a photo gate and a photodiode. The respective constituent elements may be constructed into one chip together with a processor, or may be constructed as a separate chip from the processor.

Figure 24:
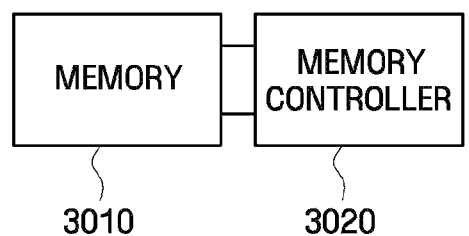
FIG. 24 is an exemplary block diagram of a memory system using a nonvolatile memory device according to embodiments of the present inventive concept.

FIG. 24 is a block diagram of a memory system using a nonvolatile memory device according to embodiments of the present inventive concept.

As illustrated, the memory system includes a memory 3010 is coupled to a memory controller 3020. The memory 3010 may be any one according to the above-described embodiments. The memory controller 3020 provides an input signal for controlling the operation of the memory 3010. For example, the memory controller 3020 may send a command and an address signal. The memory controller 3020 may include a memory interface, a host interface, an ECC circuit, a CPU (Central Processing Unit), and a buffer memory. The memory interface may transmit data from the buffer memory to the memory 3010, and may read the data from the memory 3010 and transmit the data to the buffer memory. Further, the memory interface may transmit the command or the address from an external host to the memory 3010.

The host interface may communicate with the external host through a USB (Universal Serial Bus), an SCSI (Small Computer System Interface), a PCI express, an ATA, a PATA (Parallel ATA), a SATA (Serial ATA), or a SAS (Serial Attached SCSI).

The memory system according to embodiments of the present inventive concept may have an ECC circuit. The ECC circuit may generate a parity bit using the data transmitted to the memory 3010. The generated parity bit may be stored in a specific region of the memory 3010 together with the data. The ECC circuit may sense an error of the data that is read from the memory 3010. If the sensed error is correctable, then the ECC circuit can correct the data.

The CPU controls the external host or the memory 3010 through the host interface or the memory interface. The CPU may control write, read, and erase operations in accordance with firmware.

The buffer memory temporarily store write data provided from the external source or data read from the memory 3010. Further, the buffer memory may store metadata or cache data to be stored in the memory 3010. During a sudden power-off operation, the metadata or the cache data stored in the buffer memory may be stored in the memory 3010. The buffer memory may be a DRAM or an SRAM.

Figure 25:
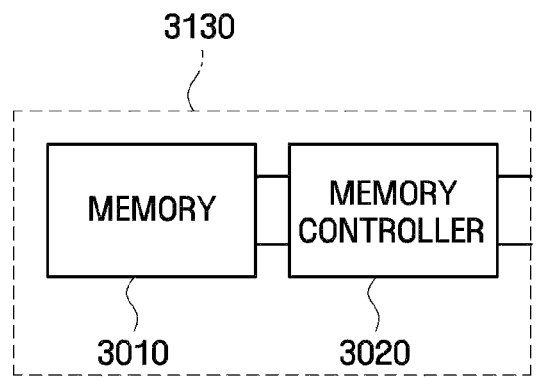
FIG. 25 is another exemplary block diagram of a memory system using a nonvolatile memory device according to embodiments of the present inventive concept.

FIG. 25 is another exemplary block diagram of a memory system using a nonvolatile memory device according to embodiments of the present inventive concept. The memory system of FIG. 25 can be substantially the same as the memory system of FIG. 24. A different point is that the memory 3010 and the memory controller 3020 are embedded in a card 3130. For example, the card 3130 may be a flash memory card. That is, the card 3130 may be standard product that is used in a consumer electronic appliance, such as a digital camera and a personal computer. The memory controller 3020 may control the memory 3010 in accordance with a control signal provided from another device, for example, an external device.

Figure 26:
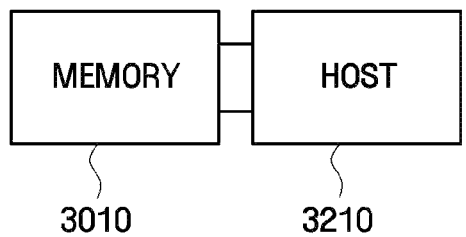
FIG. 26 is another exemplary block diagram of a memory system using a nonvolatile memory device according to embodiments of the present inventive concept.

FIG. 26 is still another exemplary block diagram of a memory system using a nonvolatile memory device according to embodiments of the present inventive concept. As illustrated, a memory 3010 may be coupled to a host system 3210. The host system 3210 may use the memory 3010 as an erasable storage device. As described above, the host system 3210 may provide an input signal for controlling the memory 3010. For example, the host system 3210 may provide a command CMD and an address signal.

Figure 27:
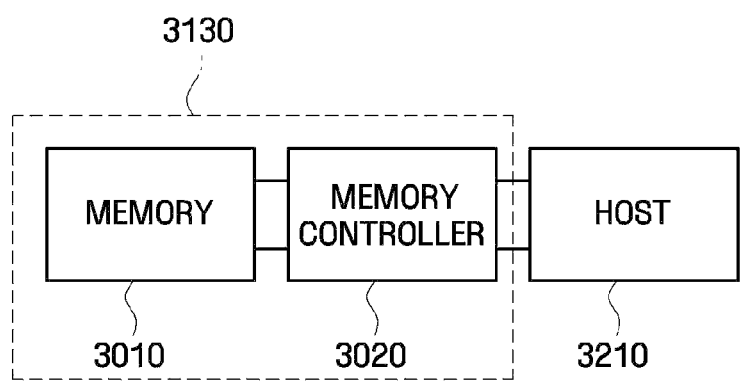
FIG. 27 is another exemplary block diagram of a memory system using a nonvolatile memory device according to embodiments of the present inventive concept.

FIG. 27 is still another exemplary block diagram of a memory system using a nonvolatile memory device according to embodiments of the present inventive concept. A host system 3210 and a card 3130 are coupled to each other. The host system 3210 can provide a control signal to the card 3130, and the memory controller 3020 can control the memory 3010, for example, according to the control signal.

Figure 28:
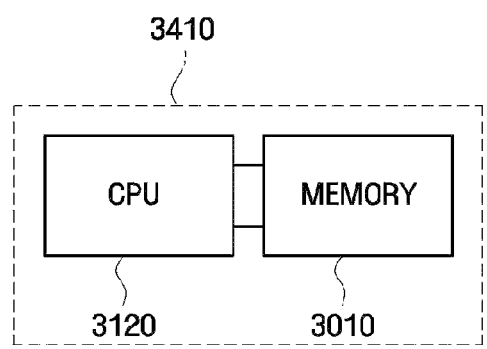
FIG. 28 is another exemplary block diagram of a memory system using a nonvolatile memory device according to embodiments of the present inventive concept.

FIG. 28 is still another exemplary block diagram of a memory system using a nonvolatile memory device according to embodiments of the present inventive concept. A memory 3010 is provided in a CPU 3120 of a computer system 3410. For example, the computer system 3410 may be a personal computer or a PDA. The memory 3010 may be directly connected to the CPU 3120 through a bus.

The nonvolatile memory device according to embodiments of the present inventive concept may be used as an SCM (Storage Class Memory). The SCM refers to a general memory concept having both nonvolatile characteristics and access characteristics. The SCM may be used as a data storage region and a program operating region.

The nonvolatile memory device using a resistance material, such as the PRAM, the RRAM, and the MRAM as described above, may be used as the SCM. The SCM may be used as a data storage memory in place of a flash memory, or may be used as a main memory in place of an SRAM. One SCM can substitute for a flash memory and an SRAM.

Figure 29:
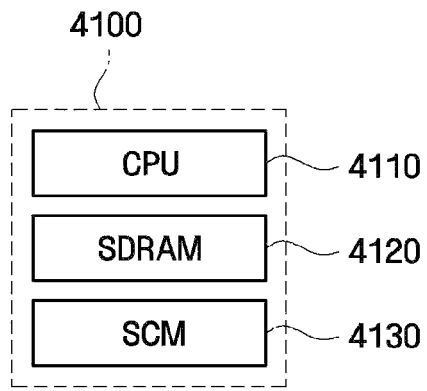
FIG. 29 is an exemplary block diagram illustrating a memory system using a Storage Class Memory (SCM).

FIG. 29 is an exemplary block diagram illustrating a memory system using SCM. A memory system 4100 includes a CPU 4110, an SDRAM 4120, and an SCM 4130 used in place of a flash memory.

In the memory system 4100, a data access speed of the SCM 4130 is higher than the speed of the flash memory. For example, in a PC environment, when the CPU 4110 operates at 4 GHz, the access speed of the PRAM that is a kind of SCM is 32 times higher than the access speed of the flash memory. Accordingly, the memory system 4100 can obtain a higher-speed access gain than the memory system mounted with the flash memory.

Figure 30:
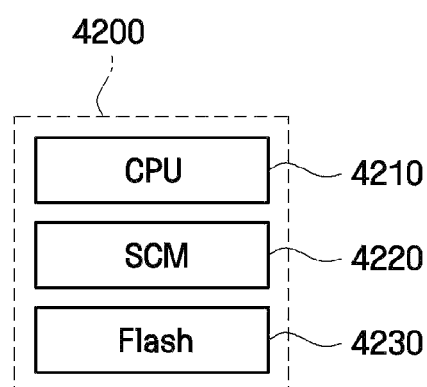
FIG. 30 is another exemplary block diagram illustrating a memory system using SCM.

FIG. 30 is another exemplary block diagram illustrating a memory system using SCM. A memory system 4200 includes a CPU 4210, an SCM 4220 used in place of an SDRAM, and a flash memory 4230.

In the memory system 4200, the SCM 4220 uses less power than the SDRAM. The energy used by a main memory of a computer system is about 40% of the energy used by the whole system. Accordingly, many persons make efforts to reduce the energy used in the main memory. The SCM can reduce, on an average, about 53% of dynamic energy use, and can reduce, on an average, about 73% of energy use due to leakage power. As a result, the memory system 4200 can reduce more energy than the memory system mounted with the SDRAM.

Figure 31:
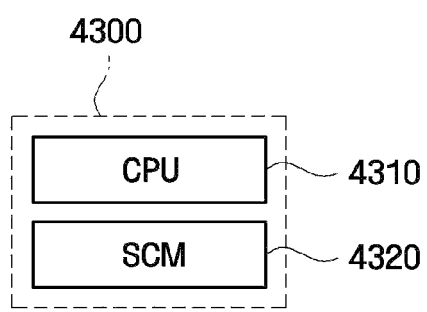
FIG. 31 is another exemplary block diagram illustrating a memory system using SCM.

FIG. 31 is still another exemplary block diagram illustrating a memory system using SCM. A memory system 4300 includes a CPU 4310 and an SCM 4320 used in place of an SDRAM and a flash memory. For example, the SCM 4320 can be used as a main memory in place of the SDRAM, and is used as a data storage memory in place of the flash memory. Accordingly, the memory system 4300 has advantages in data access speed, low power, space utilization, and cost.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:
1. A nonvolatile memory device comprising:
 a resistance memory cell;
 a first sensing node;
 a first clamping unit connected between the resistance memory cell and the first sensing node to provide a first clamping bias to the resistance memory cell, wherein the first clamping bias increases over time;
 a first compensation unit providing a compensation current to the first sensing node; and
 a first sense amplifier connected to the first sensing node to sense a level change of the first sensing node,
 wherein in response to first data stored in the resistance memory cell, an output value of the first sense amplifier transitions to a different state after a first amount of time from a time point from where the first clamping bias starts, and
 wherein in response to second data that is different from the first data stored in the resistance memory cell, the output value of the first sense amplifier transitions to the different state after a second amount of time that is different from the first amount of time from the time point from where the first clamping bias starts, and
 an enable signal generation unit that generates an enable signal, wherein the enable signal generation unit includes:
 a reference resistor;
 a second sensing node;
 a second clamping unit connected between the reference resistor and the second sensing node to provide a second clamping bias to the reference resistor;
 a second compensation unit providing second compensation current to the second sensing node; and
 a second sense amplifier connected to the second sensing node to sense a level change of the second sensing node,
 wherein during the read period, the second clamping bias is changed over time.

2. The nonvolatile memory device of claim 1, wherein the first sense amplifier operates multiple times in response to the enable signal that becomes active multiple times during a read period.

3. The nonvolatile memory device of claim 2, further comprising an enable signal generation unit that generates the enable signal,
wherein the enable signal generation unit includes a plurality of reference resistors, and an active time point of the enable signal differs to correspond to resistance values of the reference resistors.

4. The nonvolatile memory device of claim 3, wherein the read period is a normal read period, and wherein the reference resistor includes the resistance memory cell.

5. The nonvolatile memory device of claim 3, wherein the read period is a verify read period, and wherein the reference resistor includes polysilicon.

6. The nonvolatile memory device of claim 3, wherein the enable signal generation unit comprises a plurality of reference blocks generating a plurality of reference output signals, and further comprises an operator device that receives the plurality of reference output signals and that outputs the enable signal.

7. The nonvolatile memory device of claim 1, wherein the first compensation current and the second compensation current are equal to each other.

8. The nonvolatile memory device of claim 1, wherein the first clamping bias and the second clamping bias are equal to each other.

9. The nonvolatile memory device of claim 1, wherein the first compensation unit adjusts an enable time point of the first sense amplifier through adjustment of a size of the first compensation current.

10. The nonvolatile memory device of claim 1, wherein the first clamping bias is increased in the form of a k-th order function (where, k is a natural number) over time.

11. The nonvolatile memory device of claim 1, wherein the first clamping bias is increased in a step form over time.

12. The nonvolatile memory device of claim 1, wherein a memory cell array that includes the resistance memory cell has a cross point structure.

13. A nonvolatile memory device comprising:
a resistance memory cell storing a multi-bit data;
a first sensing node;
a first clamping unit connected between the resistance memory cell and the first sensing node to provide a first clamping bias to the resistance memory cell;
a first compensation unit providing first compensation current to the first sensing node; and
a first sense amplifier connected to the first sensing node to sense a level change of the first sensing node,
wherein during a read period, the first compensation current is constant, the first clamping bias is increased over time, and the first sense amplifier is enabled multiple times to sense the level change of the first sensing node; and
an enable signal generation unit generating an enable signal, wherein the enable signal generation unit includes:
a reference resistor;
a second sensing node;
a second clamping unit connected between the reference resistor and the second sensing node to provide a second clamping bias to the reference resistor;
a second compensation unit that provides a second compensation current to the second sensing node; and
a second sense amplifier connected to the second sensing node to sense a level change of the second sensing node,
wherein during the read period, the second clamping bias is changed over time.

14. The nonvolatile memory device of claim 13, wherein the first sense amplifier operates multiple times in response to the enable signal that becomes active multiple times during a read period.

15. The nonvolatile memory device of claim 14, further comprising an enable signal generation unit generating the enable signal,
wherein the enable signal generation unit includes a plurality of reference resistors, and an active time point of the enable signal differs to correspond to resistance values of the reference resistors, and
wherein the enable signal generation unit includes a plurality of reference blocks that generate a plurality of reference output signals, and an operator device that receives the plurality of reference output signals and outputs the enable signal.

16. The nonvolatile memory device of claim 13, wherein the first compensation unit adjusts an enable time point of the first sense amplifier through adjustment of a size of the first compensation current.

17. The nonvolatile memory device of claim 13, wherein a memory cell array that includes the resistance memory cell has a cross point structure.

18. A nonvolatile memory device comprising:
a first sensing node, wherein a first protection current is input to the first sensing node and a cell current is output from the first sensing node;
a resistance memory cell through which the cell current flows;
a first sense amplifier that senses a voltage level of the first sensing node;
a second sensing node, wherein a second protection current is input to the second sensing node and a reference current is output from the second sensing node;
a reference resistor through which the reference current flows; and
a second sense amplifier that senses a voltage level of the second sensing node,
wherein in response to an output value of the second sense amplifier being transitioned in accordance with the voltage level of the second sensing node, the first sense amplifier is enabled to sense the voltage level of the first sensing node.

19. The nonvolatile memory device of claim 18, further comprising a first clamping unit connected between the first sensing node and the resistance memory cell to provide a first clamping bias to the resistance memory cell,
wherein the first clamping bias is increased over time.

20. The nonvolatile memory device of claim 18, further comprising a second clamping unit connected between the second sensing node and the reference resistor to provide a second clamping bias to the reference resistor,
wherein the second clamping bias is increased over time.

21. A nonvolatile memory device comprising:
a first clamping unit connected between a resistance memory cell and a first sensing node to provide a first clamping bias, which is increased over time, to the resistance memory cell;
a second clamping unit connected between a reference resistor and a second sensing node to provide a second clamping bias, which is increased over time, to the reference resistor;
a second sense amplifier sensing a voltage level of the second sensing node and outputting a reference output signal;

an operator device outputting an enable signal based on the reference output signal; and a first sense amplifier sensing a voltage level of the first sensing node in response to the enable signal.

22. The nonvolatile memory device of claim 21, further comprising a compensation unit providing the same compensation current to the first sensing node and the second sensing node.

23. A nonvolatile memory device comprising:

a resistance memory cell;

first to n-th (where, n is a natural number) reference blocks that generate first to n-th reference output signals, wherein the k-th (where 1≤k≤n) reference block includes:
  a k-th reference resistor;
  a k-th sensing node;
  a k-th clamping unit connected between the k-th reference resistor and the k-th sensing node to provide a clamping bias, which is increased in process of time, to the k-th reference resistor;
  a k-th compensation unit that provides a compensation current to the k-th sensing node; and
  a k-th sense amplifier that senses a level change of the k-th sensing node and providing a k-th reference output signal; and a main sense amplifier that is enabled n times on the basis of the first to n-th reference output signals to read a resistance value of the resistance memory cell.

* * * * *